(12) United States Patent
Falcon et al.

(10) Patent No.: US 10,319,896 B2
(45) Date of Patent: Jun. 11, 2019

(54) SHIELDED INTERCONNECTS

(71) Applicant: Intel Corporation, Santa Clara, CA (US)

(72) Inventors: Javier A. Falcon, Chandler, AZ (US); Adel A. Elsherbini, Chandler, AZ (US); Johanna M. Swan, Scottsdale, AZ (US); Shawna M. Liff, Scottsdale, AZ (US); Ye Seul Nam, Chandler, AZ (US); James S. Clarke, Portland, OR (US); Jeanette M. Roberts, North Plains, OR (US); Roman Caudillo, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 11 days.

(21) Appl. No.: 15/637,682

(22) Filed: Jun. 29, 2017

(65) Prior Publication Data

US 2019/0006572 A1    Jan. 3, 2019

(51) Int. Cl.
*H01L 29/06* (2006.01)
*H01L 29/08* (2006.01)
(Continued)

(52) U.S. Cl.
CPC .......... *H01L 39/045* (2013.01); *G06N 10/00* (2019.01); *G06N 99/002* (2013.01); *H01L 23/5386* (2013.01); *H01L 23/5387* (2013.01); *H01L 23/552* (2013.01); *H01L 23/66* (2013.01); *H01L 25/16* (2013.01); *H01L 39/025* (2013.01);
(Continued)

(58) Field of Classification Search
CPC ..... H01L 39/025; H01L 39/04; H01L 39/045; H01L 39/223; H01L 39/225; H01L 39/226; H01L 39/2493; H01L 23/538; H01L 23/5386; H01L 23/5387; H01L 23/5389; H01L 23/552; H01L 23/66;
(Continued)

(56) References Cited

U.S. PATENT DOCUMENTS

2016/0364653 A1*  12/2016  Chow ................. G06N 99/002
2017/0093007 A1    3/2017  Elsherbini et al.

FOREIGN PATENT DOCUMENTS

WO    2017052647 A1    3/2017

OTHER PUBLICATIONS

Yu Chen, D. Sank, P. O'Malley, T. White, R. Barends, B. Chiaro, J. Kelly, E. Lucero, M. Mariantoni, A. Megrant, C. Neill, A. Vainsencher, J. Wenner, Y. Yin, A. N. Cleland and John M. Martinis; Multiplexed dispersive readout of superconducting phase qubits; Applied Physics Letters 2012 101:18.*

(Continued)

*Primary Examiner* — Fernando L Toledo
*Assistant Examiner* — Aaron J Gray
(74) *Attorney, Agent, or Firm* — Patent Capital Group

(57) ABSTRACT

Disclosed herein are shielded interconnects, as well as related methods, assemblies, and devices. In some embodiments, a shielded interconnect may be included in a quantum computing (QC) assembly. For example, a QC assembly may include a quantum processing die; a control die; and a flexible interconnect electrically coupling the quantum processing die and the control die, wherein the flexible interconnect includes a plurality of transmission lines and a shield structure to mitigate cross-talk between the transmission lines.

25 Claims, 16 Drawing Sheets

(51) Int. Cl.

| | |
|---|---|
| *H01L 31/0256* | (2006.01) |
| *H01L 39/22* | (2006.01) |
| *H01R 3/00* | (2006.01) |
| *H05K 1/00* | (2006.01) |
| *H05K 9/00* | (2006.01) |
| *H01L 39/04* | (2006.01) |
| *H01L 25/16* | (2006.01) |
| *H01L 23/538* | (2006.01) |
| *H01L 23/66* | (2006.01) |
| *H01L 23/552* | (2006.01) |
| *H01L 39/02* | (2006.01) |
| *H01L 39/24* | (2006.01) |
| *H01P 3/08* | (2006.01) |
| *H01P 11/00* | (2006.01) |
| *H05K 1/02* | (2006.01) |
| *G06N 99/00* | (2019.01) |
| *G06N 10/00* | (2019.01) |

(52) U.S. Cl.
CPC ........ *H01L 39/223* (2013.01); *H01L 39/2493* (2013.01); *H01P 3/081* (2013.01); *H01P 11/003* (2013.01); *H05K 1/0216* (2013.01); *H01L 2223/6627* (2013.01)

(58) Field of Classification Search
CPC .......... H01L 2223/6627; G06N 99/002; H01P 11/003; H05K 1/0216
USPC ........ 257/31; 438/497; 333/1; 174/254, 350, 174/102 R
See application file for complete search history.

(56) References Cited

OTHER PUBLICATIONS

David B Tuckerman, Michael C Hamilton, David J Reilly, Rujun Bai, George A Hernandez, John M Hornibrook, John A Sellers and Charles D Ellis; Flexible superconducting Nb transmission lines on thin film polyimide for quantum computing applications; 2016 Supercond. Sci. Technol. 29 084007.*

Anderson, C.J., "Electrical Properties of an Input-Output Cable for Josephson Applications," Rev. Sci. Instrum. 53 (11), Nov. 1982; 5 pages.

Tuckerman, David B., et al., "Flexible Superconducting Nb Transmission Lines on Thin Film Polyimide for Quantum Computing Applications," arXiv:1606_04557v1 [cond-mat.supr-con], Jun. 14, 2016; 22 pages.

* cited by examiner

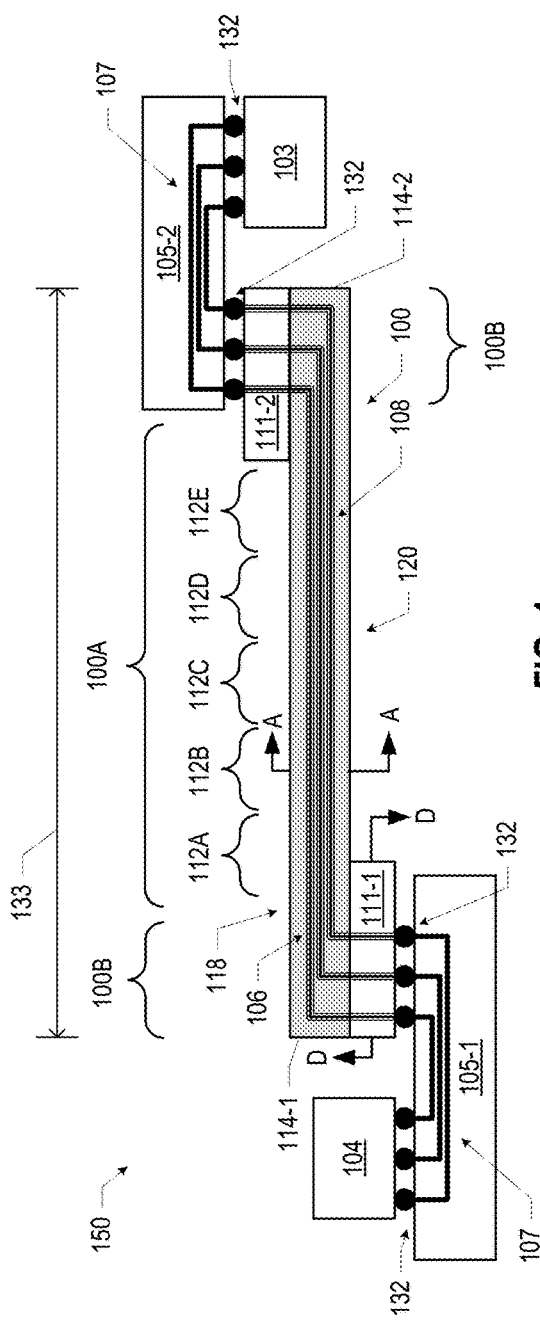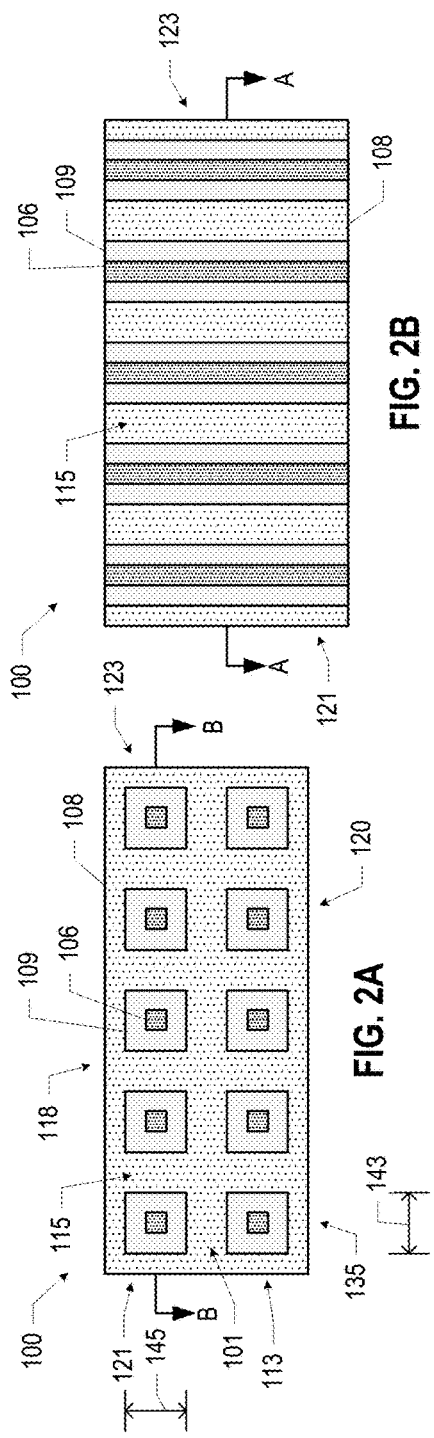

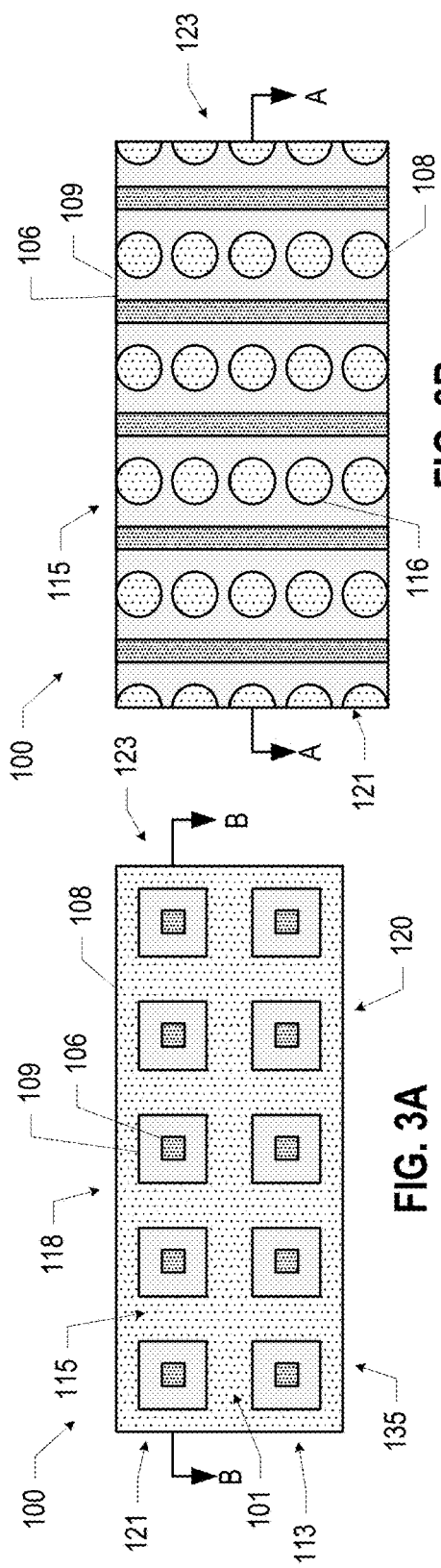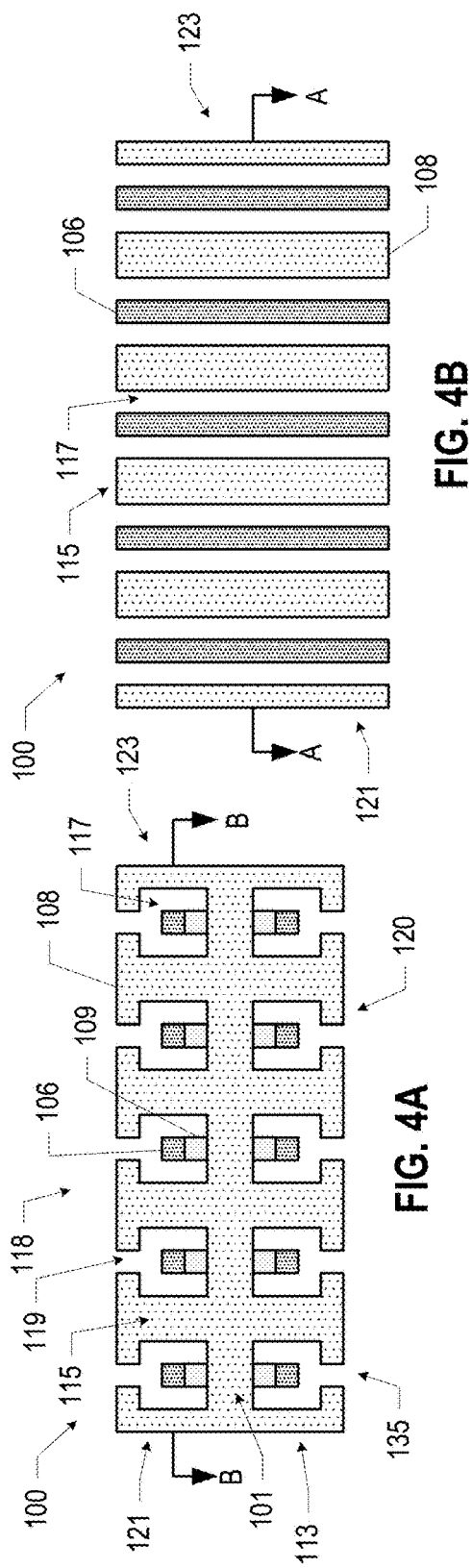

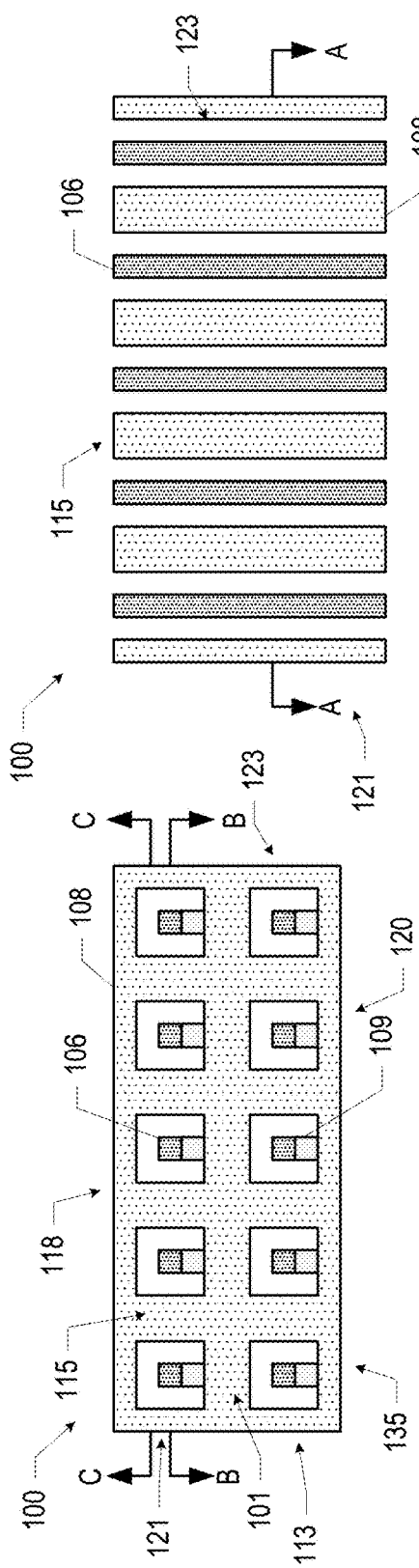
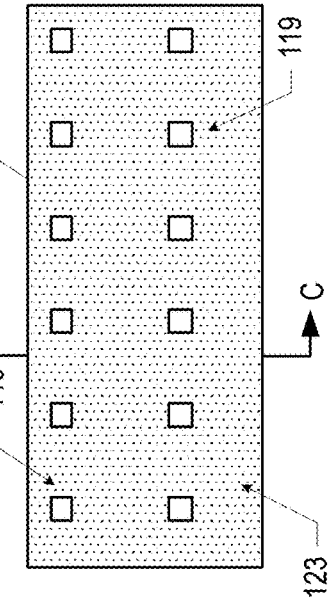
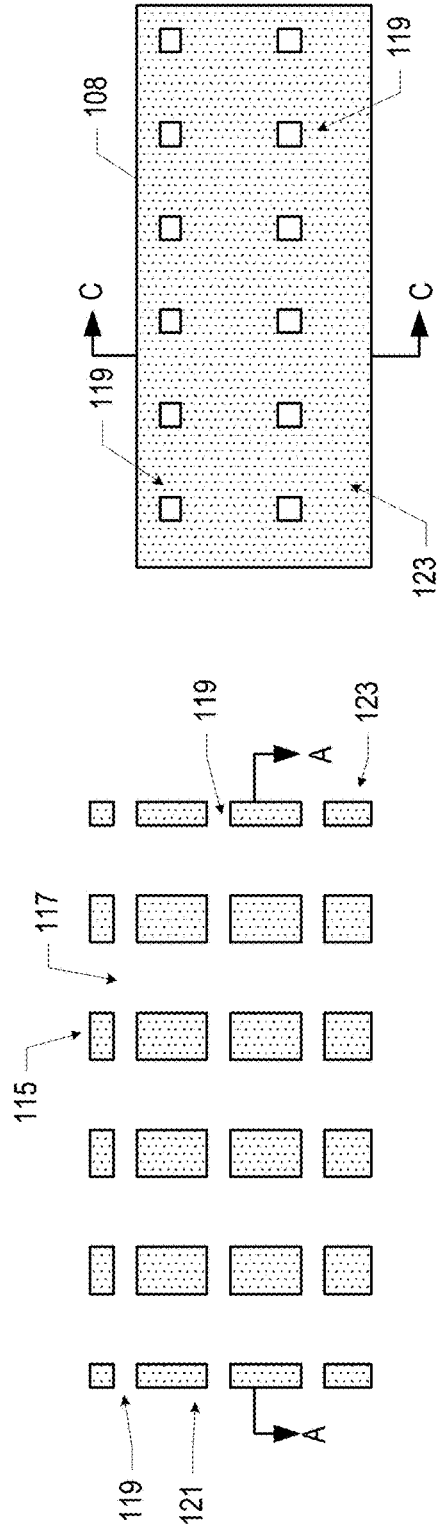
FIG. 5A
FIG. 5B
FIG. 5C
FIG. 5D

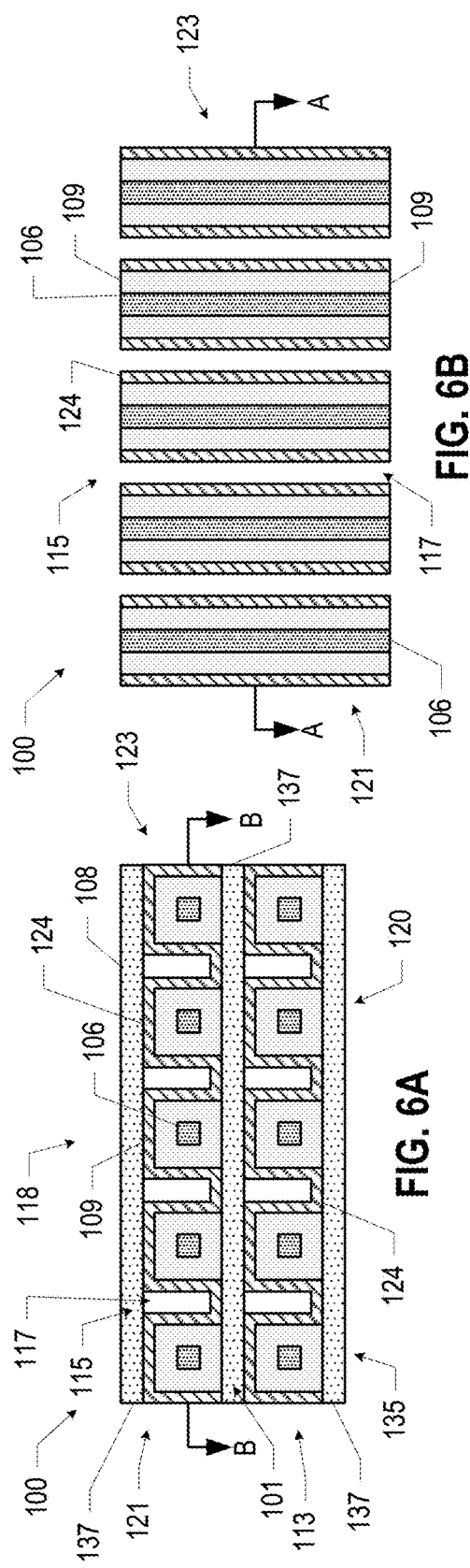

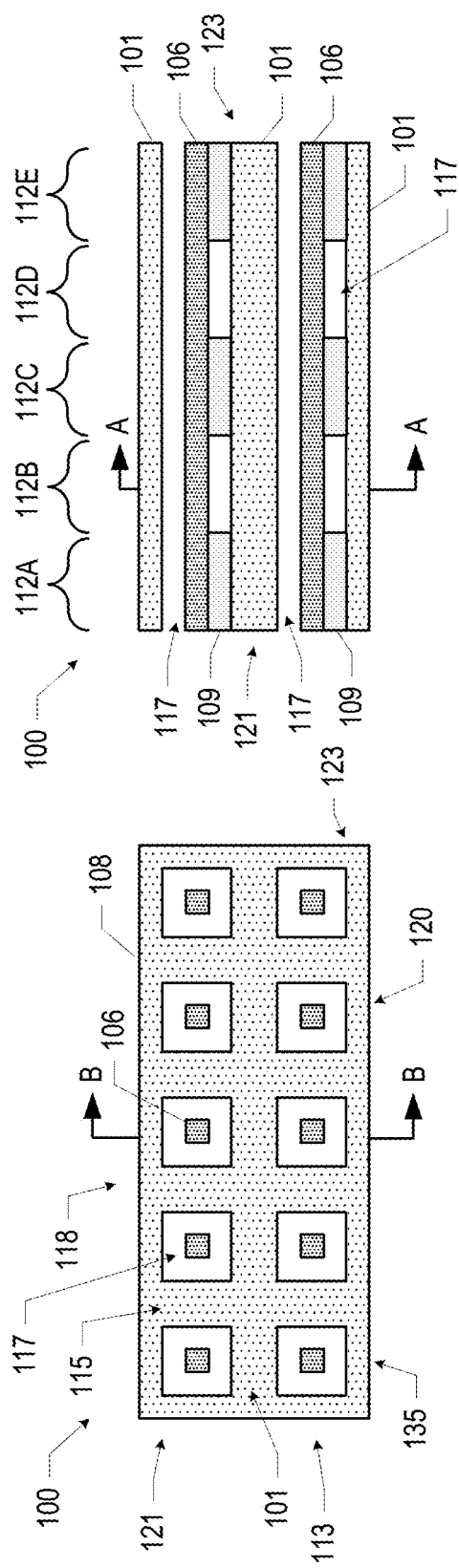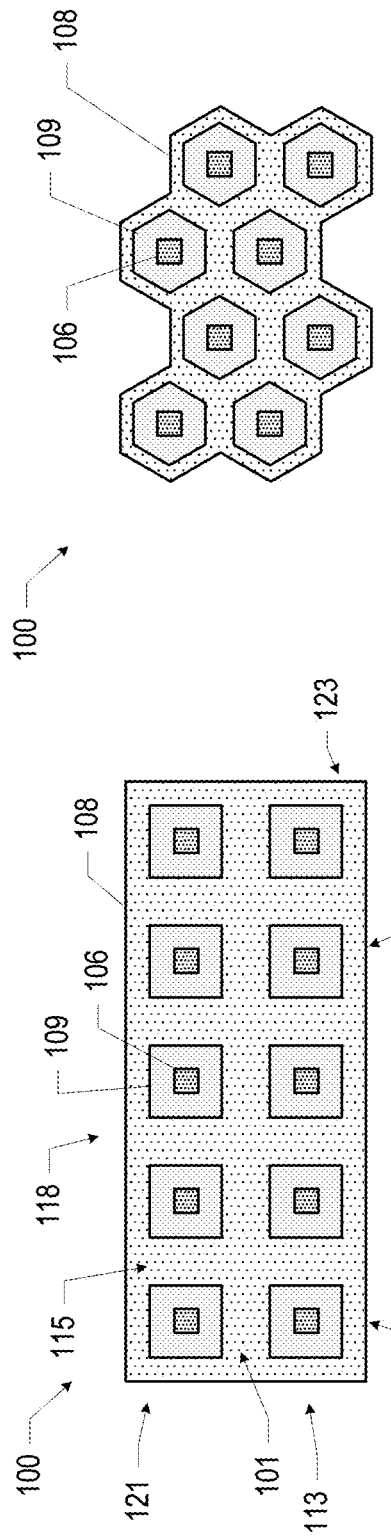

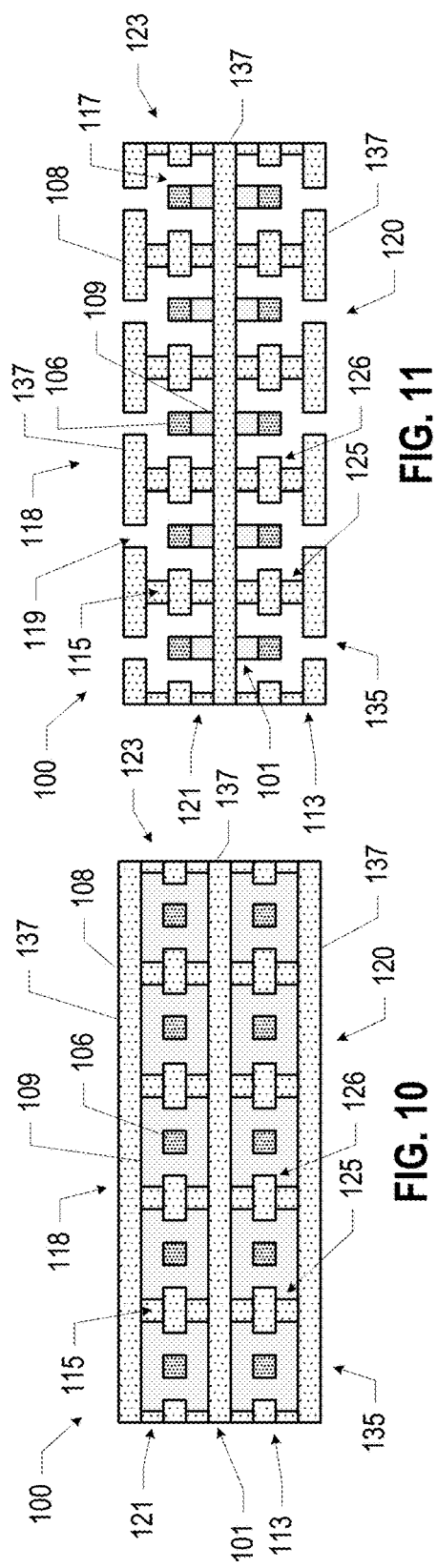
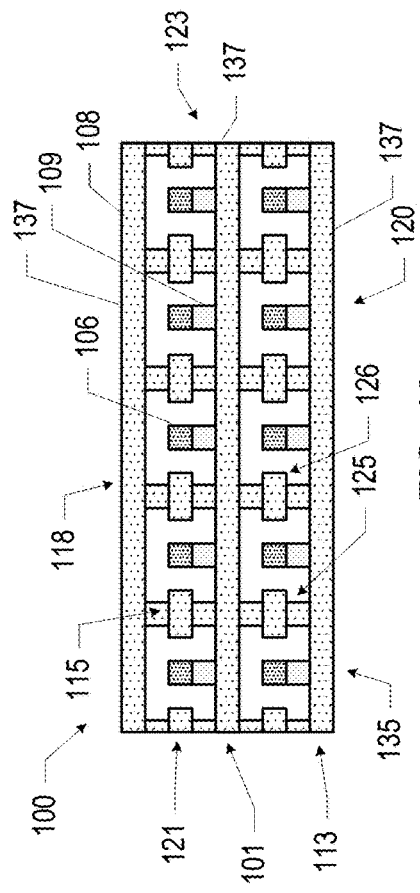
FIG. 10
FIG. 11
FIG. 12

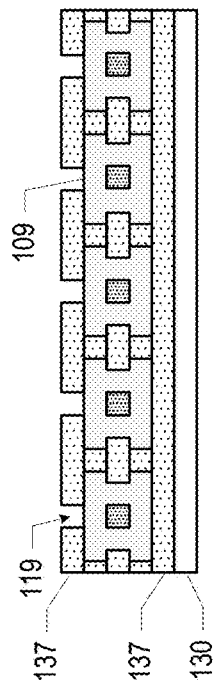
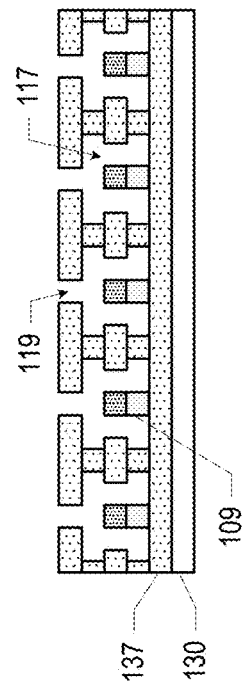
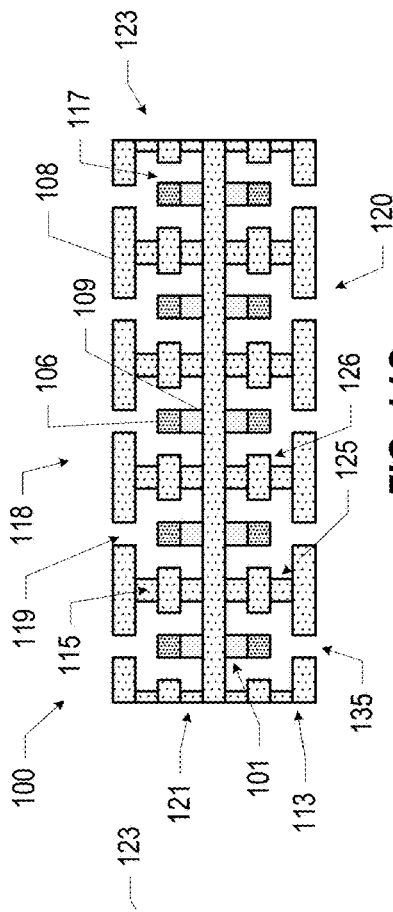
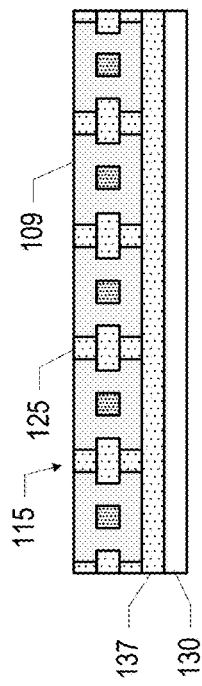
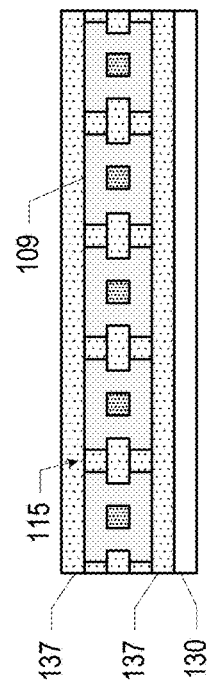
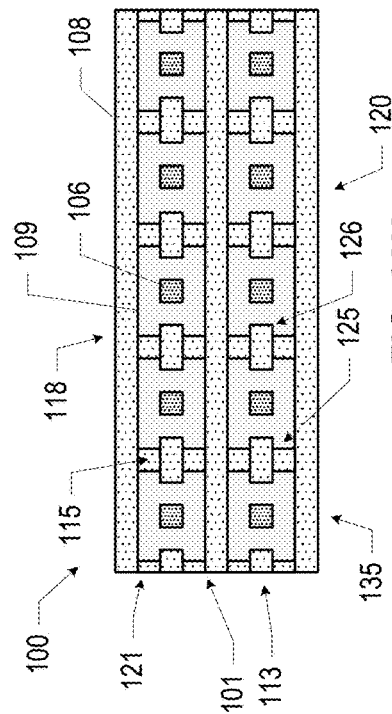

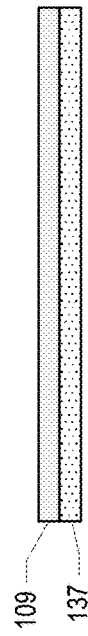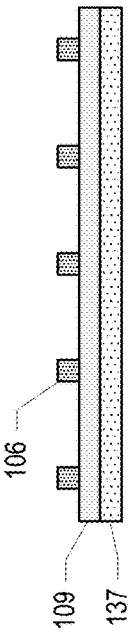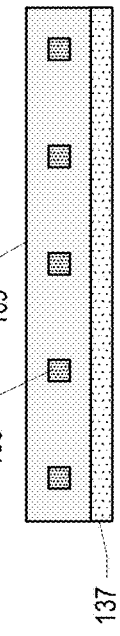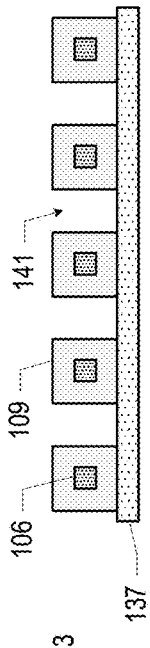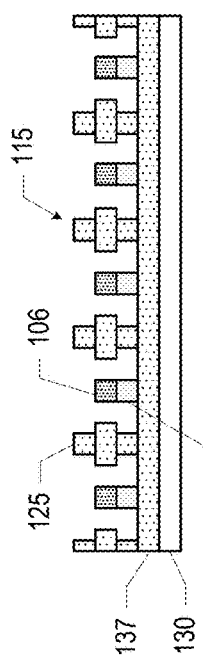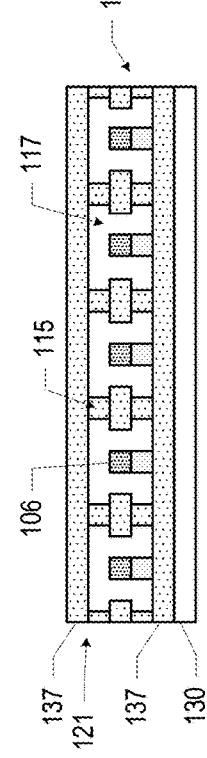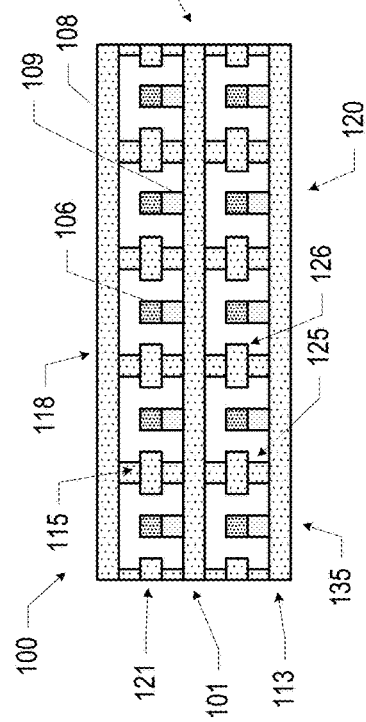

SHIELDED INTERCONNECTS

BACKGROUND

In some conventional electronic devices, coaxial cables are used to provide shielded transmission lines. Conventional coaxial cables require connectors that have a large footprint.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, not by way of limitation, in the figures of the accompanying drawings.

FIG. 1 is a side cross-sectional view of a quantum computing assembly that includes a shielded interconnect, in accordance with various embodiments.

FIGS. 2A-2B, 3A-3B, 4A-4B, 5A-5D, 6A-6C, and 7A-7B are views of various embodiments of portions of a shielded interconnect.

FIGS. 8-9 are cross-sectional views of a connection portion of a shielded interconnect.

FIGS. 10-12 are views of various embodiments of portions of a shielded interconnect.

FIGS. 13A-13H illustrate example stages in the manufacture of the portion of the shielded interconnect of FIG. 10.

FIGS. 14A-14C illustrate example stages in the manufacture of the portion of the shielded interconnect of FIG. 11.

FIGS. 15A-15C illustrate example stages in the manufacture of the portion of the shielded interconnect of FIG. 12.

FIGS. 16A-16G illustrate example stages in the manufacture of the portion of the shielded interconnect of FIG. 6.

DETAILED DESCRIPTION

Figure 13D:
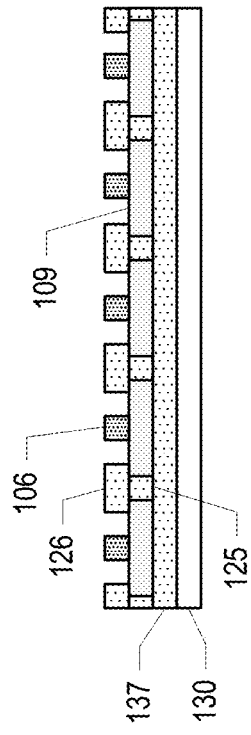

Disclosed herein are shielded interconnects, as well as related methods, assemblies, and devices. In some embodiments, a shielded interconnect may be included in a quantum computing (QC) assembly. For example, a QC assembly may include a quantum processing die; a control die; and a flexible interconnect electrically coupling the quantum processing die and the control die, wherein the flexible interconnect includes a plurality of transmission lines and a shield structure to mitigate cross-talk between the transmission lines.

Quantum computing refers to the field of research related to computation systems that use quantum mechanical phenomena to manipulate data. These quantum mechanical phenomena, such as superposition (in which a quantum variable can simultaneously exist in multiple different states) and entanglement (in which multiple quantum variables have related states irrespective of the distance between them in space or time), do not have analogs in the world of classical computing, and thus cannot be implemented with classical computing devices.

To properly operate a die that is performing desired quantum computations, it may be desirable to control hundreds of thousands or millions of individual signal lines. Such a die may be controlled by microwave pulses, and may be operated at temperatures in the milliKelvin range to limit thermal noise. To maintain the desired temperature ranges, a quantum processing die may be located in the coldest portions of a refrigeration system, while control circuitry that provides the microwave pulses may be located in warmer portions of the refrigeration system (or outside the system entirely); the quantum processing die and the control circuitry may be coupled by a cable or other interconnect. Conventional flex cables do not include the shielding required to maintain signal fidelity for quantum operation (e.g., to prevent cross-talk). Conventional coaxial cables do include shielding, but the footprints of conventional coaxial connectors are so large that only a small number of them (on the order of 10-20) can be placed on a substrate that is small enough to fit in the refrigeration system. Consequently, conventional coaxial cables are unable to meet the needs of quantum computing systems with more than a few signal lines.

Various ones of the embodiments disclosed herein provide interconnects that may be used in quantum and conventional computing systems to provide shielded signals at much higher density than achievable using conventional coaxial cables.

In the following detailed description, reference is made to the accompanying drawings that form a part hereof wherein like numerals designate like parts throughout, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The drawings are not necessarily to scale. Although many of the drawings illustrate rectilinear structures with flat walls and right-angle corners, this is simply for ease of illustration and actual devices made using these techniques will exhibit rounded corners, surface roughness, and other features. For ease of discussion, the collection of drawings of FIGS. 2A-2B may be referred to as "FIG. 2," the collection of drawings of FIGS. 13A-13H may be referred to as "FIG. 13," etc.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. When used to describe a range of dimensions, the phrase "between X and Y" represents a range that includes X and Y. As used herein, the terms "conductive" and "electrically conductive" are synonymous unless otherwise indicated.

As used herein, terms indicating what may be considered an idealized behavior, such as "superconducting" or "lossless," are intended to cover functionality that may not be exactly ideal but is within acceptable margins for a given application. For example, a certain level of loss, either in terms of nonzero electrical resistance or a nonzero amount of spurious two-level systems may be acceptable, and thus the resulting materials and structures may still be referred to by these "idealized" terms. Specific values associated with an acceptable level of loss are expected to change over time as fabrication precision improves and as fault-tolerant schemes become more tolerant of higher losses, all of which are within the scope of the present disclosure.

As used herein, a "magnet line" refers to a magnetic field-generating structure to influence (e.g., change, reset, scramble, or set) the spin states of quantum dots. One example of a magnet line, as discussed herein, is a conductive structure that is proximate to an area of quantum dot formation and selectively conductive of a current pulse that generates a magnetic field to influence a spin state of a quantum dot in the area. As used herein, two locations are "fluidly coupled" or in "fluid communication" if there is a channel between them for a fluid (e.g., a liquid or gas, such as air) to flow.

FIG. 1 is a side cross-sectional view of a QC assembly 150 that includes a shielded interconnect 100, in accordance with various embodiments. Although particular QC settings are discussed herein, the shielded interconnects 100 may be included in non-QC settings (e.g., to couple different portions of a non-QC system). For example, the shielded interconnects 100 may be included in variants of the QC assembly 150 in which QC components (e.g., the quantum processing (QP) die 104, discussed below) are replaced with non-QC components (e.g., a non-quantum processing die).

The QC assembly 150 of FIG. 1 includes a QP die 104 mechanically and electrically coupled to a circuit component 105-1 by coupling structures 132, a control die 103 mechanically and electrically coupled to a circuit component 105-2 by coupling structures 132, and a shielded interconnect 100 mechanically and electrically coupled to the circuit component 105-1 and the circuit component 105-2 by different sets of coupling structures 132. In particular, the circuit component 105-1 may include conductive contacts (not shown) at its face that may be coupled to corresponding conductive contacts (not shown) of the QP die 104 by a set of coupling structures 132; similarly, the circuit component 105-2 may include conductive contacts (not shown) at its face that may be coupled to corresponding conductive contacts (not shown) of the control die 103 by another set of coupling structures 132.

The shielded interconnect 100 may have a top surface 118, a bottom surface 120, two side faces (parallel to the plane of the drawing and not illustrated in FIG. 1, but identified as side surfaces 121 and 123 in subsequent drawings), and two ends 114-1 and 114-2. As noted above, the use of terms like "top," "bottom," and "side" is simply for ease of illustration, and does not restrict the orientation of the shielded interconnect 100. The shielded interconnect 100 may include a connection portion 111-1 proximate to the end 114-1 of the shielded interconnect 100, and the connection portion 111-1 may be coupled to the circuit component 105-1 by coupling structures 132. The shielded interconnect 100 may also include a connection portion 111-2 proximate to the end 114-2 of the shielded interconnect 100 (with the end 114-1 opposite to the end 114-2), and the connection portion 111-2 may be coupled to the circuit component 105-2 by coupling structures 132. In particular, the circuit component 105-1 may include conductive contacts (not shown) at its face that may be coupled to corresponding conductive contacts (not shown) of the connection portion 111-1 by a set of coupling structures 132; similarly, the circuit component 105-2 may include conductive contacts (not shown) at its face that may be coupled to corresponding conductive contacts (not shown) of the connection portion 111-2 by another set of coupling structures 132. In some embodiments, the circuit component 105-1 may be omitted and the connection portion 111-1 may be coupled directly to the QP die 104 (through coupling structures 132). In some embodiments, the circuit component 105-2 may be omitted and the connection portion 111-2 may be coupled directly to the control die 103 (through coupling structures 132).

The shielded interconnect 100 may include transmission lines 106 and a shield structure 108 that extend through the shielded interconnect 100 and are in electrical contact with the conductive contacts (not shown) of the connection portions 111. In FIG. 1, the transmission lines 106 and the shield structure 108 are schematically represented by a thick inner line bordered by two thinner outer lines; particular example structures for the transmission lines 106 and the shield structure 108 are discussed in detail herein. The circuit components 105 may each include conductive structures 107; electrical signals may thus be communicated between the QP die 104 and the control die 103 via the conductive structures 107 and the transmission lines 106 of the shielded interconnect 100. In the QC assembly 150, the shield structure 108 may be coupled to a ground or other reference point shared by the QP die 104 and the control die 103.

In some embodiments, the transmission lines 106 and/or the shield structure 108 may include a superconducting material, such as aluminum, niobium, tin, titanium, osmium, zinc, molybdenum, tantalum, vanadium, or composites of such materials (e.g., niobium titanium, niobium aluminum, titanium nitride, or niobium tin). In other embodiments, the transmission lines 106 and/or the shield structure 108 may include non-superconducting materials, such as copper.

The conductive contacts disclosed herein may be formed of any suitable conductive material (e.g., a superconducting material), and may take any suitable form, such as solder bond pads, posts, or bumps. In some embodiments, the conductive contacts may include multiple layers of material that may be selected to serve different purposes. In some embodiments, the conductive contacts may be formed of aluminum, and may include a layer of gold (e.g., with a thickness of less than 1 micron) between the aluminum and the adjacent interconnect to limit the oxidation of the surface of the contacts and improve the adhesion and wetting with adjacent solder. Alternate materials for the surface finish include palladium, platinum, silver, and tin. In some embodiments, the conductive contacts may be formed of aluminum, and may include a layer of a barrier metal such as nickel, platinum, or chromium, as well as a layer of gold, or other appropriate material, wherein the layer of barrier metal is disposed between the aluminum and the layer of gold, and the layer of gold is disposed between the barrier metal and the adjacent interconnect. In such embodiments, the gold, or other surface finish, may protect the barrier metal surface from oxidation before assembly (and may help with solder wetting), and the barrier metal may limit the diffusion of solder from the adjacent interconnects into the aluminum. The coupling structures 132 may include solder or a mechanical coupling structure. The shape of the footprints of the conductive contacts may be circular, square, rectangular, or polygonal for the signal traces of the conductive structures 107 and circular, square, rectangular, polygonal, voided circular, voided square, voided rectangular, or voided polygonal for the ground shielding around the signal traces of the conductive structures 107 to maintain high isolation between the signal traces of the conductive structures 107.

The conductive structures 107 may include one or more vias, one or more conductive pads, or a combination of vias and conductive pads, for example. The vias of the conductive structures 107 may be formed using any suitable technique, such as lithographic patterning, laser drilling, or mechanical drilling. In some embodiments, the conductive structures 107 may include a superconducting material, such as aluminum, niobium, tin, titanium, osmium, zinc, molybdenum, tantalum, vanadium, or composites of such materials (e.g., niobium titanium, niobium aluminum, titanium nitride, or niobium tin). In other embodiments, the conductive structures 107 may include non-superconducting materials, such as copper. During operation of the QC assembly 150, electrical signals (such as power, input/output (I/O) signals, various control signals, etc.) may be routed between the QP die 104 and the control die 103 through the shielded interconnect 100.

In some embodiments, the shielded interconnect 100 may be a flexible interconnect. For example, the shielded interconnect 100 may include one or more flexible dielectric materials, such as a flexible polyimide, elastomers such as thermoplastic polyurethane or poly dimethyl siloxane (PDMS), epoxy, or build-up film. When the shielded interconnect 100 is to be exposed to cryogenic temperatures (e.g., in a quantum computing application), an appropriate flexible dielectric material (e.g., polyimide) may be selected to have desirable material properties at those temperatures. In some embodiments in which the shielded interconnect 100 is flexible, the connection portions 111 may be rigid; for example, the connection portions 111 may include epoxy resin, a fiberglass-reinforced epoxy resin, an epoxy resin with inorganic fillers, a ceramic material, or a polymer material such as a rigid polyimide. In some embodiments, the entirety of the shielded interconnect 100 may be rigid (e.g., including any of the rigid materials discussed above). In some embodiments, the shielded interconnect 100 may be formed of alternate rigid or flexible materials that may include silicon, germanium, and other group III-V and group IV materials. Other dielectric materials that may be included in a shielded interconnect 100 may include silicon oxide, silicon nitride, aluminum oxide, carbon-doped oxide, and/or silicon oxynitride. In some embodiments, the shielded interconnect 100 may include a flexible circuit board.

The coupling structures 132 may take any suitable form, such as solder balls (as shown in FIG. 1), male and female portions of a socket, a conductive adhesive, and/or any other suitable electrical coupling structure. For example, the coupling structures 132 may include flip chip (or controlled collapse chip connection, (C4)) solder bumps. In some embodiments, the coupling structures 132 may include an indium-based solder (e.g., a solder including indium or an indium alloy). Indium-based solders may be advantageous for quantum computing applications because they are superconducting and ductile at cryogenic temperatures. In some embodiments, the coupling structures 132 may be reflow soldered using an appropriate cryogenic solder (e.g., a solder including indium, such as pure indium), cold soldered using an appropriate cryogenic solder (e.g., a solder including indium, such as pure indium), or may include a press-fit connector. The dimensions of the individual coupling structures 132 in each QC assembly 150 may be selected as appropriate. For example, when a signal pathway through a coupling structure 132 is to be used for critical signals requiring lower loss lines, a larger coupling structure 132 (e.g., larger solder ball or other contact area) may be used; smaller coupling structures 132 may be used for other signal pathways to increase or maximize the routing density.

In some embodiments in which the coupling structures 132 include a conductive adhesive, the conductive adhesive may be an anisotropic conductive film (ACF). An ACF may include particles of conductive material suspended in an insulating material; when the ACF is compressed at one location, enough of the conductive particles may be brought into contact to form a conductive bridge through the ACF at that location. When a set of coupling structures 132 includes an ACF, the conductive contacts on either side of the ACF may include protrusions or other features that compress the ACF to provide an electrical pathway. In some embodiments in which the coupling structures 132 include a conductive adhesive, the conductive adhesive may include conductive particles (e.g., silver) suspended in a compliant silicone or polymer matrix. Compliant coupling structures 132 (e.g., those that deform under mechanical stress) may advantageously provide stress relief during handling and operation (e.g., in response to thermally induced stress arising from the mismatch in the coefficient of thermal expansion between different materials).

In some embodiments, a set of coupling structures 132 may permit ready decoupling of the connected structures. For example, in some embodiments in which the coupling structures 132 between a circuit component 105 and the shielded interconnect 100 include an ACF, the shielded interconnect 100 may be mechanically detached from the ACF, leaving the ACF on the circuit component 1-5. The ACF remaining on the circuit component 105 may be cleaned, and another shielded interconnect 100 (or another component) may be brought into contact with the ACF. In other embodiments, the coupling structures 132 may include a set of male/female sockets or other connectors that permit detachment and reattachment. In other embodiments, the coupling structures 132 may be less readily decoupled (e.g., when the coupling structures 132 include solder), or when the coupling structures 132 are surrounded by an underfill or encapsulant material (not shown).

The different sets of coupling structures 132 included in the QC assembly 150 need not all take the same form. For example, in some embodiments, the coupling structures 132 between the shielded interconnect 100 and the circuit components 105 may include an ACF, and the coupling structures 132 between the circuit component 105-1 and the QP die 104 (and the coupling structures 132 between the circuit component 105-2 and the control die 103) may include solder balls. More generally, any different sets of coupling structures 132 in any QC assembly 150 disclosed herein may take the same form, or may take different forms.

The control die 103 may include one or more non-quantum circuits for controlling the operation of the QP die 104. In some embodiments, the control die 103 may provide peripheral logic to support the operation of the QP die 104. For example, the control die 103 may control the performance of a read operation, control the performance of a write operation, control the clearing of quantum bits, etc. The control that the control die 103 may exercise over the operation of the QP die 104 may depend on the type of qubits implemented by the QP die 104. For example, if the QP die 104 implements superconducting qubits (discussed below with reference to FIGS. 18-22), the control die 103 may provide and/or detect appropriate currents in any of the flux bias lines, microwave lines, and/or drive lines to initialize and manipulate the superconducting dots.

The control die 103 may also perform conventional computing functions to supplement the computing functions that may be provided by the QP die 104. For example, the control die 103 may interface with one or more of the other components of a quantum computing device, such as the quantum computing device discussed below with reference to FIG. 24, in a conventional manner, and may serve as an interface between the QP die 104 and conventional components. In some embodiments, the control die 103 may be implemented in or may be used to implement the non-quantum processing device 2028 described below with reference to FIG. 24. In some embodiments, the control die 103 may include radio frequency (RF) devices, amplifiers, power management devices, antennas, arrays, sensors, microelectromechanical systems (MEMS) devices, mixers, multiplexers, analog-to-digital converters, digital-to-analog converters, and/or analog-to-digital converters, for example.

The QP die 104 may include circuitry for performing quantum computations. For example, in some embodiments, the QP die 104 may be a superconducting qubit-type quantum device (examples of which are discussed in further detail below with reference to FIGS. 18-20) or a spin qubit-type quantum device (examples of which are discussed in further detail below with reference to FIGS. 21-22).

In some embodiments, the circuit component 105 may be a circuit board (e.g., a printed circuit board (PCB)). In some embodiments, the circuit component 105 may be a package substrate. In some embodiments, the circuit component 105 may be a flexible circuit board or flexible connector (e.g., with electrical traces in or on a compliant insulating material). In some embodiments, the circuit component 105 may be a connector for a cable (not shown) that can extend outside the refrigerator during operation of the QC assembly 150. Other dies or other components (not shown) may also be coupled to a circuit component 105, and thus may be in communication with the QP die 104 and/or the control die 103.

Limiting differential expansion and contraction may help preserve the mechanical and electrical integrity of the QC assembly 150 as the QC assembly 150 is fabricated (and exposed to higher temperatures) and used in a cooled environment (and exposed to lower, cryogenic temperatures). In some embodiments, thermal expansion and contraction in the circuit component 105-1 and the QP die 104, and/or in the circuit component 105-2 and the control die 103, may be managed by maintaining an approximately uniform density of the conductive material in these collections of elements (so that different portions of these elements expand and contract uniformly), using reinforced dielectric materials as the insulating material (e.g., dielectric materials with silicon dioxide fillers), or utilizing stiffer materials as the insulating material (e.g., a prepreg material including glass cloth fibers).

The elements of the QC assembly 150 may have any suitable dimensions. For example, in some embodiments, the control die 103 and the QP die 104 may have x-y footprints with side dimensions between 2 millimeters and 100 millimeters. In some embodiments, a thickness of the control die 103 and/or the QP die 104 may be between 50 microns and 700 microns (e.g., between 100 microns and 200 microns).

In some embodiments, the length 133 of the shielded interconnect 100 may be selected to allow the QC assembly 150 to be inserted into a dilution refrigerator or other cryogenic refrigeration system so that the QP die 104 is in a lower, colder stage of the refrigerator (e.g., on the order of 10 milliKelvin) while the control die 103 is in a higher, warmer stage of the refrigerator (e.g., on the order of 4 Kelvin). In a typical refrigerator, lower (colder) stages have less heat dissipation capacity (e.g., on the order of 1 microwatt to 10 milliwatt) than higher (warmer) stages (e.g., on the order of 1 watt). Since the control die 103 may generate more heat than the QP die 104, and the control die 103 may not require the low temperatures of the lower stage, it may be desirable to select the length 133 of the shielded interconnect 100 to allow the QP die 104 to be positioned in a colder stage than the control die 103. In some embodiments, the length 133 of the shielded interconnect 100 may be between 10 centimeters and 1 meter). More generally, the length 133 of the shielded interconnect 100 may be between 2 millimeters and 1 meter.

The shielded interconnect 100 may include a longitudinal portion 100A between two transverse portions 100B. The transverse portions 100B may be located proximate to the ends 114 of the shielded interconnect 100. The longitudinal portion 100A may provide the bulk of the length of the shielded interconnect 100, and the transmission lines 106 may run longitudinally along this length. The transmission lines 106 may make a "turn" in the transverse portions 100B, running perpendicular to their orientation in the longitudinal portion 100A and extending into the connection portions 111. Similarly, the orientation of the shield structure 108 may change between the longitudinal portion 100A and the transverse portions 100B to follow the transmission lines 106. In some embodiments, the geometry of the shield structure 108 in the transverse portions 100B may be the same as its geometry in the longitudinal portion 100A (except rotated by 90 degrees), while in other embodiments, the geometry of the shield structure 108 in the transverse portions 100B may be different than in the longitudinal portion 100A (e.g., to increase packing density in the connection portions 111, as discussed below).

The transmission lines 106 and shield structures 108 may take any suitable form. For example, FIGS. 2-12 illustrate different arrangements of transmission lines 106 and shield structures 108 that may be included in a shielded interconnect 100. Although some of the embodiments illustrated in FIGS. 2-12 may be discussed with reference to a particular portion of a shielded interconnect 100 (e.g., the longitudinal portion 100A or the transverse portions 100B), any of these arrangements may be used in the longitudinal portion 100A, the transverse portions 100B, or both, in any desired combination. Additionally, although certain elements of the shielded interconnects 100 discussed below with reference to FIGS. 2-12 may have particular shapes (e.g., squares, rectangles, circles), these are simply examples, and any other shapes that preserve the structural features of the shielded interconnects 100 may be used.

The shield structures 108 of the shielded interconnects 100 disclosed herein may provide sleeves of conductive material through which the transmission lines 106 extend, shielding the transmission lines 106 from each other (and thus mitigating cross-talk) and from the external environment. The conductive material of the shield structure 108 may include any one or more of the conductive materials discussed above with reference to the conductive structures 107; for example, the shield structures 108 may include a superconducting material. In shielded interconnects 100 that include dielectric material (e.g., the dielectric material 109, discussed below), the dielectric material may take any of the forms discussed herein (e.g., any of the rigid or flexible dielectric materials discussed above). Similarly, the transmission lines 106 may include any of the materials discussed herein (e.g., a superconducting material). In the embodiments of FIGS. 2-8 and 10-12, the shield structures 108 may include a conductive material forming vertical shields 115 between transmission lines 106 in adjacent columns 135 (and between the external environment and the transmission lines 106 at the ends of the rows 113), and conductive material forming horizontal shields 101 between transmission lines 106 in adjacent rows 113 (and between the external environment and the transmission lines 106 at the ends of the columns 135).

FIG. 2 depicts one embodiment of a portion of a shielded interconnect 100. In particular, FIG. 2A is a cross-sectional view through the section A-A of FIG. 1 (and through the section A-A of FIG. 2B), and FIG. 2B is a cross-sectional view through the section B-B of FIG. 2A. In FIG. 2 (and other figures), the transmission lines 106 are shown as arranged in two rows 113 and five columns 135, but any of the shielded interconnects 100 disclosed herein may include more or fewer rows 113 and/or more or fewer columns 135 of transmission lines 106. Additionally, transmission lines 106 may be arranged in a non-rectangular array, such as an array in which the transmission lines 106 are arranged in aligned rows 113 but not in aligned columns 135, etc.

In the embodiment of FIG. 2, each transmission line 106 may be surrounded by a portion of dielectric material 109. In FIG. 2A, each transmission line 106 is illustrated as having a square cross-section, but this is simply an example, and any of the transmission lines 106 disclosed herein may have any suitable, manufacturable cross-section (e.g., circular, fin-like, etc.). Similarly, each portion of dielectric material 109 is illustrated as having a square cross-section in FIG. 2A, but this is simply an example, and any portions of dielectric material 109 disclosed herein may have any suitable, manufacturable cross-section. For example, FIG. 10 (discussed below) illustrates a particular embodiment of the shielded interconnect 100 of FIG. 2 in which the cross-section of the portions of dielectric material 109 has a more complex shape but maintains the structural features of the embodiment of FIG. 2.

In the embodiment of FIG. 2, the vertical shields 115 may be "solid" walls, as illustrated in FIG. 2B. The sleeves of the shield structure 108 illustrated in FIG. 2 have a substantially square cross-section (complementary to the outer perimeter of the portions of dielectric material 109), but as noted above, this is simply illustrative. More generally, the shield structure 108 represents a rectangular arrangement of conductive sleeves around the transmission lines 106; the embodiment of FIG. 10, discussed below, also represents a rectangular arrangement (though the "sides" of the rectangular sleeves have a more complex geometry).

The dimensions of the sleeves of the shield structure 108 around the transmission lines 106 may take any suitable values to achieve desired isolation. In some embodiments, the lateral width 143 of a sleeve (e.g., the distance between the side walls of a sleeve around a transmission line 106, provided by the vertical shields 115) may be between 25 microns and 500 microns; although the lateral width 143 is illustrated only in FIG. 2A, this range of lateral widths 143 may be applied to embodiments of any of the shielded interconnects 100 disclosed herein. In some embodiments, the vertical height 145 of a sleeve (e.g., the distance between the top wall and the bottom wall of a sleeve around a transmission line 106, provided by the horizontal shields 101) may be between 20 microns and 250 microns; although the vertical height 145 is illustrated only in FIG. 2A, this range of vertical heights 145 may be applied to embodiments of any of the shielded interconnects 100 disclosed herein.

FIG. 3 depicts another embodiment of a portion of a shielded interconnect 100. In particular, FIG. 3A is a cross-sectional view through the section A-A of FIG. 1 (and through the section A-A of FIG. 3B), and FIG. 3B is a cross-sectional view through the section B-B of FIG. 3A. In the embodiment of FIG. 3, each transmission line 106 may be surrounded by a portion of dielectric material 109, as discussed above with reference to the embodiment of FIG. 2. In contrast to the embodiment of FIG. 2, in the embodiment of FIG. 3, the vertical shields 115 may not be "solid" walls, but may instead be formed by a line of conductive pillars 116. These conductive pillars 116 may be manufactured by forming circular vias in the dielectric material 109 (e.g., using laser or mechanical drilling). The sleeves illustrated in FIG. 3 also have a substantially square cross-section (complementary to the outer perimeter of the portions of dielectric material 109), but as noted above, this is simply illustrative. More generally, the shield structure 108 of FIG. 3. also represents a rectangular arrangement of conductive sleeves around the transmission lines 106.

FIG. 4 depicts another embodiment of a portion of a shielded interconnect 100. In particular, FIG. 4A is a cross-sectional view through the section A-A of FIG. 1 (and through the section A-A of FIG. 4B), and FIG. 4B is a cross-sectional view through the section B-B of FIG. 4A. In the embodiment of FIG. 4, each transmission line 106 may be supported by a portion of dielectric material 109 between the transmission line 106 and the shield structure 108, but the shield structure 108 may also include air gaps 117 that are adjacent to associated transmission lines 106. Including air gaps 117 in a shielded interconnect 100 may reduce dielectric losses in the shielded interconnect 100, and may improve the flexibility of the shielded interconnect 100 (when the shielded interconnect 100 includes a compliant dielectric material 109 or is otherwise flexible). In some embodiments, as illustrated in FIG. 4, the air gap 117 may at least partially surround the associated transmission line. The shield structure 108 may include an opening 119 in the outer horizontal shields 101 proximate to each air gap 117 to allow fluid communication (e.g., air or vacuum) between the external environment of the shielded interconnect 100 and the air gap 117. Fluid communication between the air gaps 117 and the external environment may be desirable in cryogenic environments (e.g., quantum computing) to avoid undesirable air condensation. The openings 119 may also serve a function during manufacturing, allowing voiding of the dielectric material 109 after manufacturing the horizontal shields 101 above the dielectric material 109 (e.g., using reactive ion etching (RIE) to etch away part of the dielectric material 109, as discussed below).

In the embodiment of FIG. 4, the openings 119 associated with the "lower" row 113 of transmission lines 106 may face the bottom surface 120 of the shielded interconnect 100, while the openings 119 associated with the "upper" row 113 of transmission lines 106 may face the top surface 118 of the shielded interconnect 100. Although FIG. 4 shows the portions of dielectric material 109 as limited to the area "under" the associated transmission line 106, in some embodiments, the dielectric material 109 may extend further laterally (e.g., contacting the "side walls" of the sleeves of the shield structure 108 and/or vertically (e.g., up the sides of the transmission lines 106). Although FIG. 4 illustrates "solid" vertical shields 115, in some embodiments, the shielded interconnect 100 of FIG. 4 may include vertical shields 115 formed by a row of conductive pillars, as discussed above with reference to FIG. 3. As noted above with reference to FIGS. 2 and 3, the shield structure 108 of FIG. 4 represents a rectangular arrangement of conductive sleeves around the transmission lines 106.

FIG. 5 depicts another embodiment of a portion of a shielded interconnect 100. In particular, FIG. 5A is a cross-sectional view through the section A-A of FIG. 1 (and through the section A-A of FIGS. 5B and 5C), FIG. 5B is a cross-sectional view through the section B-B of FIG. 5A, FIG. 5C is a cross-sectional view through the section C-C of FIG. 5A, and FIG. 5D is a side view of the side surface 123. In the embodiment of FIG. 5, as in the embodiment of FIG. 4, each transmission line 106 may be supported by a portion of dielectric material 109 between the transmission line 106 and the shield structure 108, but the shield structure 108 may also include air gaps 117 that are adjacent to associated transmission lines 106. In some embodiments, as illustrated in FIG. 5, the air gap 117 may at least partially surround the associated transmission line; more generally, the air gaps 117 and the portions of dielectric material 109 of the embodiment of FIG. 5 may take any of the forms discussed above with reference to FIG. 4. In contrast to the embodiment of FIG. 4, in FIG. 5, the shield structure 108 may include openings 119 in the vertical shields 115 proximate to each air gap 117 to allow fluid communication (e.g., air or vacuum) between the external environment of the shielded interconnect 100 and the air gaps 117. In the embodiment of FIG. 5, the external openings 119 are located at the side surfaces 121 and 123, instead of at the top surface 118 and the bottom surface 120 (as illustrated in FIG. 4). As noted above with reference to FIGS. 2-4, the shield structure 108 of FIG. 5 represents a rectangular arrangement of conductive sleeves around the transmission lines 106.

FIG. 6 depicts another embodiment of a portion of a shielded interconnect 100. In particular, FIG. 6A is a cross-sectional view through the section A-A of FIG. 1 (and through the section A-A of FIG. 6B), FIG. 6B is a cross-sectional view through the section B-B of FIG. 6A, and FIG. 6C is a top view of the top surface 118. In the embodiment of FIG. 6, each row 113 of transmission lines 106 may include portions of dielectric material 109 surrounding each transmission line 106, a substantially planar sheet 137 of conductive material "below" the transmission lines 106/portions of dielectric material 109, a conformal layer 124 of conductive material over the portions of dielectric material 109 and some portions of the planar sheet 137, and air gaps 117 between adjacent ones of the transmission lines 106. The vertical shields 115 may thus be provided by the air gaps 117 and the adjacent portions of the conformal layer 124, and the horizontal shields 101 may be provided by the planar sheet 137 and adjacent portions of the conformal layer 124. The horizontal shields 101 may include openings 119 to allow fluid communication (e.g., air or vacuum) between the external environment of the shielded interconnect 100 and the air gaps 117; although a particular arrangement of these openings is illustrated in FIG. 6D, any desired number and arrangement may be used. As noted above with reference to FIGS. 2-5, the shield structure 108 of FIG. 6 represents a rectangular arrangement of conductive sleeves around the transmission lines 106. The conformal layer 124 may include any suitable conductive material; for example, in some embodiments, the conformal layer 124 may include a superconducting material.

As noted above, in some embodiments, different arrangements of shield structures 108, dielectric material 109, and transmission lines 106 may be used in the longitudinal portion 100A and the transverse portions 100B of a shielded interconnect 100. Further, in some embodiments, different arrangements of shield structures 108, dielectric material 109, and transmission lines 106 may be used in different sections of the longitudinal portion 100A of a shielded interconnect 100. For example, FIG. 1 labels five different sections 112A-112E of the longitudinal portion 100A of the shielded interconnect 100. One or more of these different sections 112A-112E may have different arrangements of shield structures 108, dielectric material 109, and transmission lines 106 than others of the sections 112A-112E. The labeling of five sections 112A-112E in FIG. 1 is simply illustrative, and the longitudinal portion 100A of the shielded interconnect 100 may have more or fewer sections with different structures, as desired.

FIG. 7 depicts another embodiment of a portion of a shielded interconnect 100 having different structures in different ones of the sections 112A-112E. In particular, FIG. 7A is a cross-sectional view through the section A-A of FIG. 1 (and through the section A-A of FIG. 7B), and FIG. 7B is a cross-sectional view through the section B-B of FIG. 7A. The sections 112A, 112C, and 112E have the same structure, and the sections 112B and 112D have the same structure (but different than the structure of sections 112A, 112C, and 112E). In particular, the sections 112B and 112D include transmission lines 106 that are entirely surrounded by air gaps 117, while the sections 112A, 112C, and 112E include portions of dielectric material 109 to support the transmission lines 106. The sections 112A, 112C, and 112E may have a structure like that discussed above with reference to FIG. 5 (or, in other embodiments, like FIG. 2, 3, or 4) to provide mechanical support to the "suspended" transmission lines 106 in sections 112B and 112D. As noted above with reference to FIGS. 2-6, the shield structure 108 of FIG. 7 represents a rectangular arrangement of conductive sleeves around the transmission lines 106.

As noted above, in some embodiments, the arrangement of transmission lines 106 and shield structures in the transverse portions 100B, and the connection portions 111, may be the same as in the longitudinal portion 100A or different. FIGS. 8 and 9 are cross-sectional views of a connection portion 111 of a shielded interconnect 100. In particular, FIGS. 8 and 9 are cross-sectional views through the section D-D of FIG. 1. The embodiment of FIG. 8 has substantially the same form as the embodiment of FIG. 2; it may be used in combination with any of the other embodiments discussed herein for the longitudinal portion 110A. As noted above with reference to FIGS. 2-7, the shield structure 108 of FIG. 8 represents a rectangular arrangement of conductive sleeves around the transmission lines 106. The embodiment of FIG. 9 includes a shield structure 108 having a hexagonal arrangement of conductive sleeves around the transmission lines 106; it may be used in combination with any of the other embodiments discussed herein for the longitudinal portion 110A. In some embodiments, a hexagonal arrangement of conductive sleeves in the shield structure 108 may allow the transmission lines 106 to be more densely packed than an equivalent rectangular arrangement. More generally, the pitch of transmission lines 106 in the connection portions 111 (and, in some embodiments, in the transverse portions 100B) may be smaller than the pitch of the transmission lines 106 in the longitudinal portion 100A. Greater density of the transmission lines 106 in the connection portions 111 may enable a smaller footprint for the connection portions 111 for a given number of transmission lines 106.

Any of a number of different manufacturing techniques may be used to form the shielded interconnects 100 disclosed herein. For example, FIGS. 10, 11, and 12 are cross-sectional views of various implementations of the shielded interconnects 100 of FIGS. 2, 3, and 5, respectively. The shielded interconnect 100 of FIG. 12 may include openings 119 (not shown) in the side surfaces 121 and 123 to provide fluid communication between the air gaps 117 and the external environment, as discussed above with reference to FIG. 5. In FIGS. 10-12, the horizontal shields 101 are provided by substantially planar sheets 137 of conductive material, while the vertical shields 115 are provided by a stack of line vias 125 and conductive pads 126. A line via 125 may be formed by lithography, and may provide a "wall" that extends into and out of the plane of the drawings of FIGS. 10-12; a line via 125 may be contrasted with circular vias, which have a circular footprint and may be conventionally formed by laser or mechanical drilling. The planar sheets 137, the line vias 125, and the conductive pads 126 may include any of the materials discussed herein with reference to the shield structures 108. The particular number and arrangement of line vias 125 and conductive pads 126 in the vertical shields 115 of FIGS. 10-12 is simply illustrative, and any number and arrangement may be used to achieve a desired geometry. FIGS. 13, 14, and 15 illustrate example stages in the manufacture of the shielded interconnects 100 of FIGS. 10, 11, and 12, respectively.

Figure 13E:
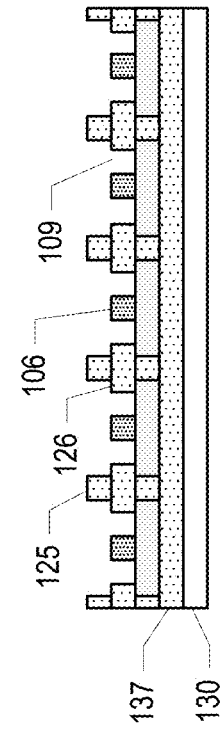
Figure 13A:
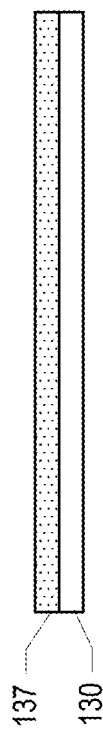

Turning to FIG. 13, FIG. 13A is a cross-sectional view of an assembly including a support 130 and a planar sheet 137 of conductive material. The support 130 may include any suitable material, such as any of the dielectric materials disclosed herein. The planar sheet 137 may be deposited on the support 130 using any suitable technique, such as lamination or gluing.

Figure 13B:
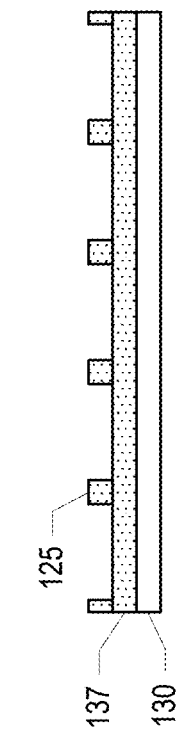

FIG. 13B is a cross-sectional view of an assembly subsequent to forming line vias 125 on the assembly of FIG. 13A. Any suitable technique may be used to form the line vias 125 (e.g., providing a conductive seed layer, providing a photoresist on the seed layer, patterning the photoresist to selectively expose the seed layer using a lithographic technique, electroplating conductive material on the exposed seed layer to form the line vias 125, then stripping the photoresist).

Figure 13C:
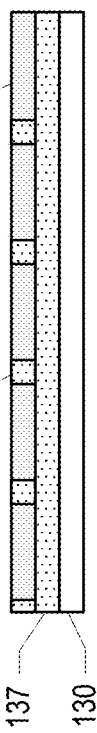

FIG. 13C is a cross-sectional view of an assembly subsequent to providing a dielectric material 109 on the assembly of FIG. 13B. In some embodiments, the dielectric material 109 may be deposited between and on the line vias 125 (e.g., using lamination, spin coating, or slit coating and curing), then polished back (e.g., using a mechanical polishing technique, or a chemical mechanical polishing (CMP) technique). The operations of FIGS. 13B and 13C may represent a "line vias first" technique; in "line vias last" embodiments, the dielectric material 109 may be deposited first, then the line vias 125 may be formed therein (e.g., by etching the dielectric material 109, depositing conductive material for the line vias 125 on the etched dielectric material 109, and then removing the overburden of conductive material). Any of the "line vias first" techniques disclosed herein may be replaced by a "line vias last" technique, as appropriate.

FIG. 13D is a cross-sectional view of an assembly subsequent to forming conductive pads 126 and transmission lines 106 on the assembly of FIG. 13C. Although the conductive pads 126 and the transmission lines 106 are depicted in FIG. 13D with different fill patterns, this is simply for illustrative purposes, and the material composition of the conductive pads 126 and the transmission lines 106 may be the same. Any suitable technique may be used to form the conductive pads 126 and the transmission lines 106 (e.g., the lithographic techniques discussed above with reference to FIGS. 13B and 13C).

FIG. 13E is a cross-sectional view of an assembly subsequent to forming line vias 125 on the assembly of FIG. 13D (e.g., using any of the techniques discussed above with reference to FIG. 13B).

FIG. 13F is a cross-sectional view of an assembly subsequent to providing a dielectric material 109 on the assembly of FIG. 13E (e.g., using any of the techniques discussed above with reference to FIG. 13C).

FIG. 13G is a cross-sectional view of an assembly subsequent to providing a planar sheet 137 of conductive material on the assembly of FIG. 13F. The planar sheets 137 may provide the horizontal shields 101, and the stacks of line vias 125 and conductive pads 126 may provide the vertical shields 115. The planar sheet 137 may be formed using any suitable technique (e.g., lamination or gluing)

FIG. 13H is a cross-sectional view of an assembly subsequent to repeating the operations of FIGS. 13B-13G to form another row of transmission lines 106, and removing the support 130, resulting in the portion of the shielded interconnect 100 of FIG. 10. The operations of FIGS. 13B-13G may be repeated as many times as desired to form as many rows 113 of transmission lines 106 as desired.

As noted above, FIG. 14 illustrates example stages in a method of manufacturing the portion of the shielded interconnect 100 illustrated in FIG. 11. The operations of FIG. 14 may begin with the assembly of FIG. 13G.

FIG. 14A is a cross-sectional view of an assembly subsequent to patterning the topmost planar sheet 137 with openings 119 that expose the portions of dielectric material 109. Any suitable etch technique may be used to form the openings 119 (e.g., lithographic techniques).

FIG. 14B is a cross-sectional view of an assembly subsequent to removing much of the dielectric material 109 from the assembly of FIG. 14A, leaving portions of dielectric material 109 to provide mechanical support for the transmission lines 106. In some embodiments, a reactive ion etch (RIE) technique may be used to remove the dielectric material 109. A similar technique may be used to form the "hanging" transmission lines 106 of the sections 1126 and 112D discussed above with reference to FIG. 7; in such embodiments, all the dielectric material 109 may be removed.

FIG. 14C is a cross-sectional view of an assembly subsequent to removing the support 130, "flipping" the result, and repeating the operations of FIGS. 13B-13G and FIG. 14A to form another row 113 of transmission lines 106, resulting in the portion of the shielded interconnect 100 of FIG. 11. In some embodiments, the support 130 may not be removed, and may instead remain a part of the shielded interconnect 100. The removal of the dielectric material 109 may also be performed after "flipping" the assembly of FIG. 14A and forming a similar assembly on the backside.

As noted above, FIG. 15 illustrates example stages in a method of manufacturing the portion of the shielded interconnect 100 illustrated in FIG. 12. The operations of FIG. 15 may begin with the assembly of FIG. 13F.

FIG. 15A is a cross-sectional view of an assembly subsequent to removing much of the dielectric material 109 from the assembly of FIG. 13F, leaving portions of dielectric material 109 to provide mechanical support for the transmission lines 106. The dielectric material 109 may be removed in accordance with any of the techniques discussed above with reference to FIG. 14B.

FIG. 15B is a cross-sectional view of an assembly subsequent to providing a planar sheet 137 of conductive material on the assembly of FIG. 15A. Providing the planar sheet 137 may form the air gaps 117, and the assembly of FIG. 15B may include openings 119 (not shown) on the side surfaces 121 and 123 to provide fluid communication between the air gaps 117 and the external environment, as discussed above with reference to FIG. 5. The planar sheets 137 may provide the horizontal shields 101, and the stacks of line vias 125 and conductive pads 126 may provide the vertical shields 115.

FIG. 15C is a cross-sectional view of an assembly subsequent to repeating the operations of FIGS. 13B-13F and 15A-15B to form another row of transmission lines 106, and removing the support 130, resulting in the portion of the shielded interconnect 100 of FIG. 12. The operations of FIGS. 13B-13F and 15A-15B may be repeated as many times as desired to form as many rows 113 of transmission lines 106 as desired. In some embodiments, the support 130 may not be removed, and may instead remain a part of the shielded interconnect 100.

FIG. 16 illustrates example stages in a method of manufacturing the portion of the shielded interconnect 100 of FIG. 6. In FIG. 16, the planar sheets 137 may include any of the materials discussed herein with reference to the shield structures 108.

FIG. 16A is a cross-sectional view of an assembly including a planar sheet 137 of conductive material and a layer of dielectric material 109 (e.g., a build-up film) on the planar sheet 137. The layer of dielectric material 109 may be provided on the planar sheet 137 using any suitable technique (e.g., lamination, spin coating, slit coating, etc.)

FIG. 16B is a cross-sectional view of an assembly subsequent to forming transmission lines 106 on the assembly of FIG. 16A (e.g., using any of the lithographic techniques discussed above with reference to FIG. 13B).

FIG. 16C is a cross-sectional view of an assembly subsequent to providing additional dielectric material 109 (e.g., a build-up film) on the assembly of FIG. 16B (e.g., using any of the techniques discussed above with reference to FIG. 13C).

FIG. 16D is a cross-sectional view of an assembly subsequent to forming recesses 141 in the dielectric material 109 of the assembly of FIG. 16C between adjacent ones of the transmission lines 106. The recesses 141 may expose portions of the planar sheet 137 between adjacent ones of the transmission lines 106. Any suitable etch technique may be used to etch the dielectric material 109 (e.g., using a mask with an RIE technique). In some embodiments, molding may be performed.

Figure 16E:
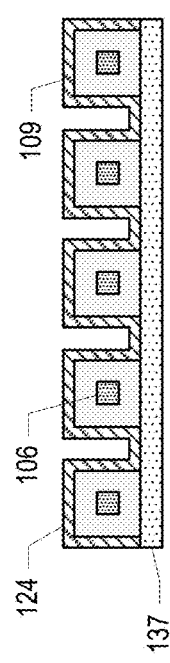

FIG. 16E is a cross-sectional view of an assembly subsequent to providing a conformal layer 124 of conductive material on the assembly of FIG. 16D. The conformal layer 124 may take any of the forms disclosed herein (e.g., a superconducting material), and may be provided using any suitable technique (e.g., atomic layer deposition (ALD) or sputtering).

Figure 16F:
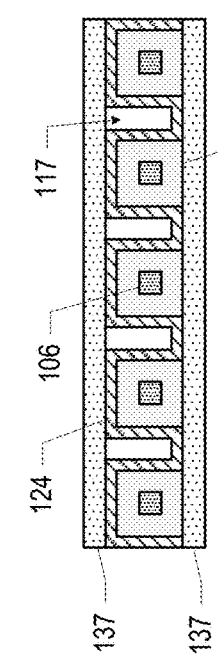

FIG. 16F is a cross-sectional view of an assembly subsequent to providing a planar sheet 137 of conductive material on the assembly of FIG. 16E (e.g., by lamination) to form the air gaps 117, and patterning the planar sheet 137 (and the adjacent conformal layer 124) with openings 119 (not shown) to provide fluid communication between the air gaps 117 and the external environment. Any suitable techniques may be used to provide and pattern the planar sheet 137 (e.g., any of the techniques disclosed herein).

Figure 16G:
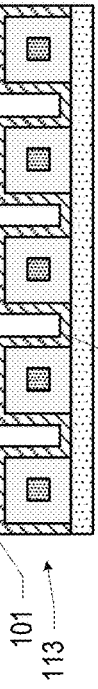

FIG. 16G is a cross-sectional view of an assembly subsequent to repeating the operations of FIGS. 16A-16F to form another row of transmission lines 106, resulting in the portion of the shielded interconnect 100 of FIG. 6. The operations of FIGS. 16A-16F may be repeated as many times as desired to form as many rows 113 of transmission lines 106 as desired.

Many of the accompanying drawings illustrate a single transmission line 106 included in each sleeve of a shield structure 108. This may provide a "coaxial" arrangement. In other embodiments, any of the shielded interconnects 100 disclosed herein may include multiple transmission lines 106 in a single sleeve of a shield structure 108, forming a twinaxial or multiaxial arrangement, as desired. The manufacturing techniques and structures disclosed herein are readily applicable to such twinaxial or multiaxial arrangements.

Figure 17:
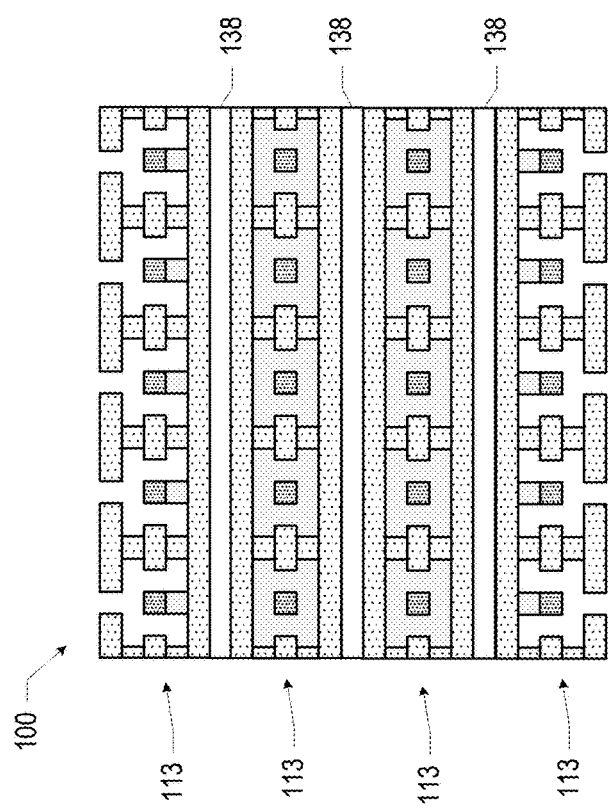
FIG. 17 is a cross-sectional view of a portion of a shielded interconnect.

Any of the arrangements of transmission lines 106 and shield structures 108 disclosed herein may be used in any combination in a shielded interconnect 100, in accordance with the present disclosure. For example, FIG. 17 is a cross-sectional view of a shielded interconnect 100 including four rows 113 of transmission lines 106. The "outer" rows 113 take the form illustrated in FIG. 11, while the "inner" rows take the form illustrated in FIG. 10. The different rows 113 may be secured together with a dielectric material 138 (e.g., a dielectric adhesive or any of the dielectric materials 109 discussed herein). Including multiple different arrangements of transmission lines 106 and shield structures 108 in a shielded interconnect 100 may provide more flexibility in trading ease of manufacturing and mechanical stability for lower losses for different signal lines. For example, in some embodiments of the shielded interconnect of FIG. 17, the outer rows 113 of transmission lines 106 may have improved shielding relative to the inner rows 113; the transmission lines 106 in the outer rows 113 may be used for critical signals (e.g., those that are very sensitive to noise and cross-talk), while the transmission lines 106 in the inner rows 113 may be used for less critical signals (e.g., those that can tolerate higher losses).

Figure 18:
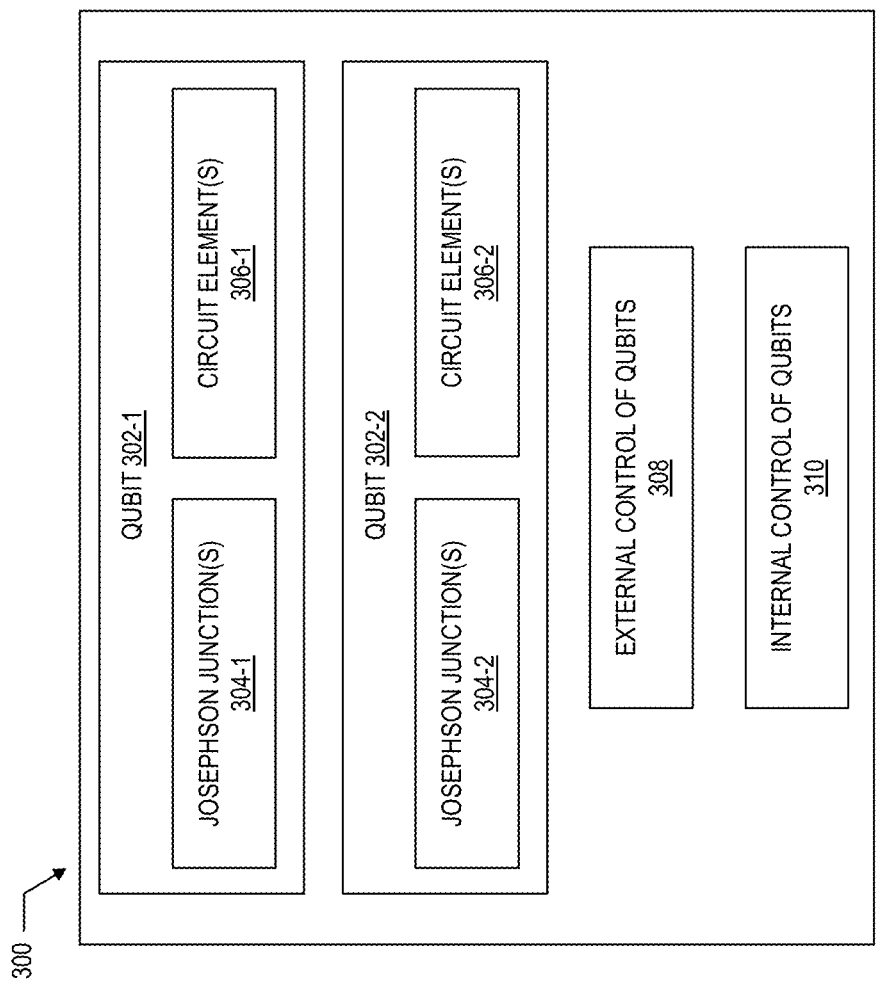
FIG. 18 is a block diagram of an example superconducting qubit-type quantum device, in accordance with various embodiments.
Figure 19:
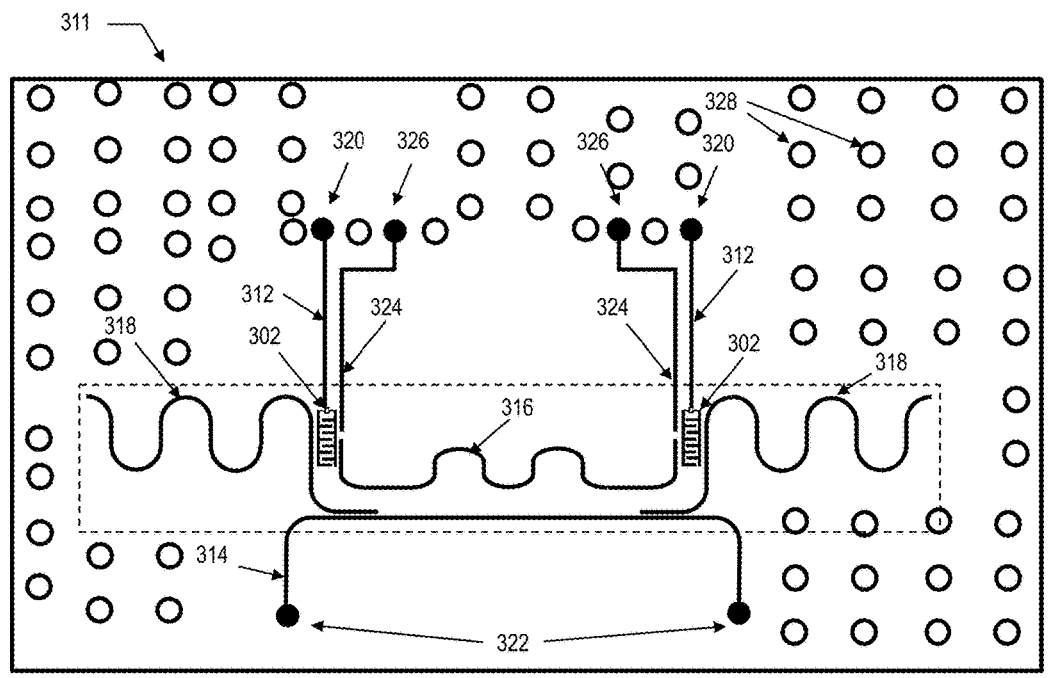
FIGS. 19 and 20 illustrate example physical layouts of superconducting qubit-type quantum devices, in accordance with various embodiments.
Figure 20:
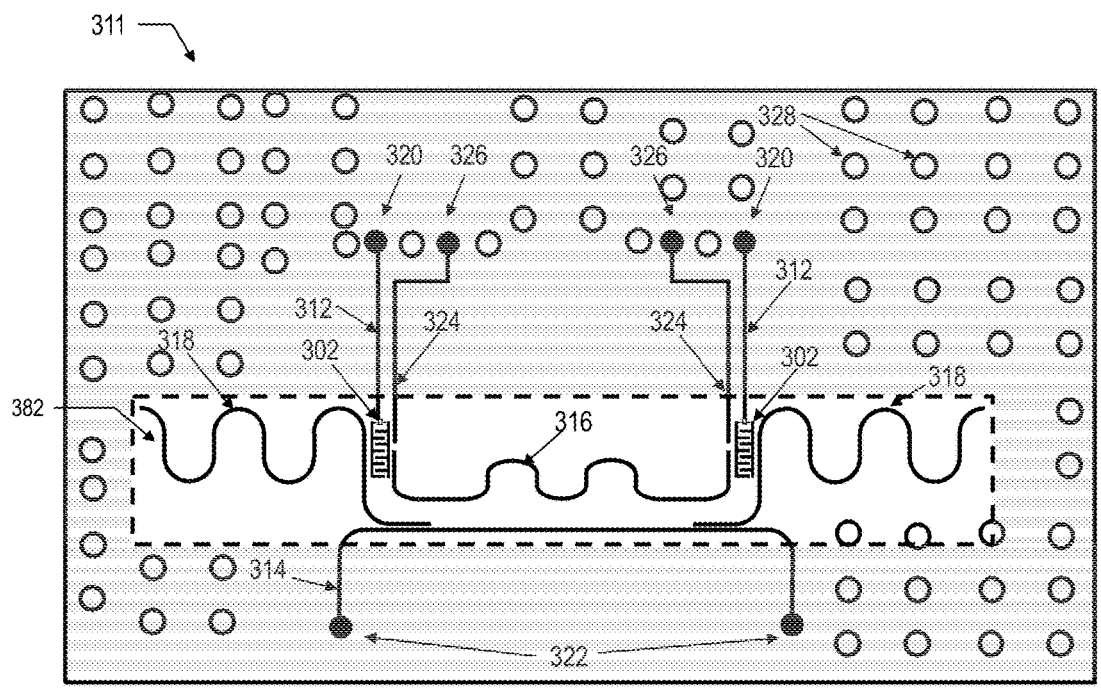

As noted above, the QP die(s) 104 included in a QC assembly 150 may take any form. FIGS. 18-20 discuss example embodiments in which the QP die 104 is a superconducting qubit-type quantum device, and FIGS. 21-22 discuss example embodiments in which the QP die 104 is a spin qubit-type quantum device.

The operation of superconducting qubit-type quantum devices may be based on the Josephson effect, a macroscopic quantum phenomenon in which a supercurrent (a current that, due to zero electrical resistance, flows for indefinitely long without any voltage applied) flows across a device known as a Josephson junction. Examples of superconducting qubit-type quantum devices may include charge qubits, flux qubits, and phase qubits. Transmons, a type of charge qubit with the name being an abbreviation of "transmission line shunted plasma oscillation qubits," may exhibit reduced sensitivity to charge noise, and thus may be particularly advantageous. Transmon-type quantum devices may include inductors, capacitors, and at least one nonlinear element (e.g., a Josephson junction) to achieve an effective two-level quantum state system.

Josephson junctions may provide the central circuit elements of a superconducting qubit-type quantum device. A Josephson junction may include two superconductors connected by a weak link. For example, a Josephson junction may be implemented as a thin layer of an insulating material, referred to as a barrier or a tunnel barrier and serving as the "weak link" of the junction, sandwiched between two layers of superconductor. Josephson junctions may act as superconducting tunnel junctions. Cooper pairs may tunnel across the barrier from one superconducting layer to the other. The electrical characteristics of this tunneling are governed by the Josephson relations. Because the inductance of a Josephson junction is nonlinear, when used in an inductor-capacitor circuit (which may be referred to as an LC circuit) in a transmon-type quantum device, the resulting circuit has uneven spacing between its energy states. In other classes of superconducting qubit-type quantum devices, Josephson junctions combined with other circuit elements may similarly provide the non-linearity necessary for forming an effective two-level quantum state to act as a qubit.

FIG. 18 is a block diagram of an example superconducting quantum circuit 300 that may be included in a QP die 104. As shown in FIG. 18, a superconducting quantum circuit 300 includes two or more qubits, 302-1 and 302-2. Qubits 302-1 and 302-2 may be identical and thus the discussion of FIG. 18 may refer generally to the "qubits 302"; the same applies to Josephson junctions 304-1 and 304-2, which may generally be referred to as "Josephson junctions 304," and to circuit elements 306-1 and 306-2, which may generally be referred to as "circuit elements 306." As shown in FIG. 18, each of the superconducting qubits 302 may include one or more Josephson junctions 304 connected to one or more other circuit elements 306, which, in combination with the Josephson junction(s) 304, may form a nonlinear circuit providing a unique two-level quantum state for the qubit. The circuit elements 306 could be, for example, capacitors in transmons or superconducting loops in flux qubits.

A superconducting quantum circuit 300 may include circuitry 308 for providing external control of qubits 302 and circuitry 310 for providing internal control of qubits 302. In this context, "external control" refers to controlling the qubits 302 from outside of the QP die 104 that includes the qubits 302, including control by a user of a quantum computer, while "internal control" refers to controlling the qubits 302 within QP die 104. For example, if qubits 302 are transmon qubits, external control may be implemented by means of flux bias lines (also known as "flux lines" and "flux coil lines") and by means of readout and drive lines (also known as "microwave lines" since qubits are typically designed to operate with microwave signals), described in greater detail below. On the other hand, internal control lines for such qubits may be implemented by means of resonators (e.g., coupling and readout resonators, also described in greater detail below).

FIG. 19 illustrates an example of a physical layout 311 of a superconducting quantum circuit where qubits are implemented as transmons. Like FIG. 18, FIG. 19 illustrates two qubits 302. In addition, FIG. 19 illustrates flux bias lines 312, microwave lines 314, a coupling resonator 316, a readout resonator 318, and conductive contacts 320 and 322. The flux bias lines 312 and the microwave lines 314 may be viewed as examples of the external control circuitry 308 shown in FIG. 18.

Running a current through the flux bias lines 312, provided from the conductive contacts 320, enables the tuning of the frequency of the corresponding qubits 302 to which each line 312 is connected. For example, a magnetic field is created by running the current in a particular flux bias line 312. If such a magnetic field is in sufficient proximity to the qubit 302, the magnetic field couples to the qubit 302, thereby changing the spacing between the energy levels of the qubit 302. This, in turn, changes the frequency of the qubit 302 since the frequency is related to the spacing between the energy levels via Planck's equation. Provided there is sufficient multiplexing, different currents can be sent down each of the flux lines 312, allowing for independent tuning of the various qubits 302.

Typically, the qubit frequency may be controlled to bring the frequency either closer to or further away from another resonant element, such as a coupling resonator 316 as shown in FIG. 19 that connects two or more qubits 302 together. For example, if it is desired that a first qubit 302 (e.g. the qubit 302 shown on the left side of FIG. 19) and a second qubit 302 (e.g. the qubit 302 shown on the right side of FIG. 19) interact, via the coupling resonator 316 connecting these qubits, then both qubits 302 may be tuned at nearly the same frequency. In other scenarios, two qubits 302 could interact via a coupling resonator 316 at specific frequencies, but these three elements do not have to be tuned to be at nearly the same frequency with one another. Interactions between the qubits 302 can similarly be reduced or prevented by controlling the current in the appropriate flux bias lines. The state(s) of each qubit 302 may be read by way of its corresponding readout resonator 318. As discussed below, the qubit 302 may induce a resonant frequency in the readout resonator 318. This resonant frequency is then passed to the microwave lines 314 and communicated to the conductive contacts 322.

A readout resonator 318 may be provided for each qubit. The readout resonator 318 may be a transmission line that includes a capacitive connection to ground on one side and is either shorted to ground on the other side (for a quarter-wavelength resonator) or has a capacitive connection to ground (for a half-wavelength resonator), which results in oscillations within the transmission line (resonance). The resonant frequency of the oscillations may be close to the frequency of the qubit 302. The readout resonator 318 may be coupled to the qubit 302 by being in sufficient proximity to the qubit 302 (e.g., through capacitive or inductive coupling). Due to the coupling between the readout resonator 318 and the qubit 302, changes in the state of the qubit 302 may result in changes of the resonant frequency of the readout resonator 318. In turn, because the readout resonator 318 is in sufficient proximity to the microwave line 314, changes in the resonant frequency of the readout resonator 318 may induce changes in the current in the microwave line 314, and that current can be read externally via the conductive contacts 322.

The coupling resonator 316 may be used to couple different qubits together to realize quantum logic gates. The coupling resonator 316 may be similar to the readout resonator 318 in that it is a transmission line that may include capacitive connections to ground on both sides (for a half-wavelength resonator), which may result in oscillations within the coupling resonator 316. Each side of the coupling resonator 316 may be coupled (again, either capacitively or inductively) to a respective qubit 302 by being in sufficient proximity to the qubit 302. Because each side of the coupling resonator 316 couples with a respective different qubit 302, the two qubits 302 may be coupled together through the coupling resonator 316. In this manner, a state of one qubit 302 may depend on the state of the other qubit 302, and vice versa. Thus, coupling resonators 316 may be employed to use a state of one qubit 302 to control a state of another qubit 302.

In some implementations, the microwave line 314 may be used to not only readout the state of the qubits 302 as described above, but also to control the state of the qubits 302. When a single microwave line 314 is used for this purpose, the line 314 may operate in a half-duplex mode in which, at some times, it is configured to readout the state of the qubits 302, and, at other times, it is configured to control the state of the qubits 302. In other implementations, microwave lines such as the line 314 shown in FIG. 19 may be used to only readout the state of the qubits as described above, while separate drive lines (such as the drive lines 324 shown in FIG. 19) may be used to control the state of the qubits 302. In such implementations, the microwave lines used for readout may be referred to as readout lines (e.g., the readout line 314), while microwave lines used for controlling the state of the qubits may be referred to as drive lines (e.g., the drive lines 324). The drive lines 324 may control the state of their respective qubits 302 by providing (e.g., using conductive contacts 326 as shown in FIG. 19) a microwave pulse at the qubit frequency, which in turn stimulates a transition between the states of the qubit 302. By varying the length of this pulse, a partial transition can be stimulated, giving a superposition of the states of the qubit 302.

Flux bias lines, microwave lines, coupling resonators, drive lines, and readout resonators, such as those described above, together form interconnects for supporting propagation of microwave signals. Further, any other connections for providing direct electrical interconnection between different quantum circuit elements and components, such as connections from Josephson junction electrodes to capacitor plates or to superconducting loops of superconducting quantum interference devices (SQUIDS) or connections between two ground lines of a particular transmission line for equalizing electrostatic potential on the two ground lines, are also referred to herein as interconnects. Electrical interconnections may also be provided between quantum circuit elements and components and non-quantum circuit elements, which may also be provided in a quantum circuit, as well as to electrical interconnections between various non-quantum circuit elements provided in a quantum circuit. Examples of non-quantum circuit elements that may be provided in a quantum circuit may include various analog and/or digital systems, e.g. analog-to-digital converters, mixers, multiplexers, amplifiers, etc. In some embodiments, these non-quantum elements may be included in the control die 103.

Coupling resonators and readout resonators may be configured for capacitive coupling to other circuit elements at one or both ends to have resonant oscillations, whereas flux bias lines and microwave lines may be similar to conventional microwave transmission lines because there is no resonance in these lines. Each one of these interconnects may be implemented as any suitable architecture of a microwave transmission line, such as a coplanar waveguide, a stripline, a microstrip line, or an inverted microstrip line. Typical materials to make the interconnects include aluminum, niobium, niobium nitride, titanium nitride, molybdenum rhenium, and niobium titanium nitride, all of which are particular types of superconductors. However, in various embodiments, other suitable superconductors and alloys of superconductors may be used as well.

In various embodiments, the interconnects as shown in FIG. 19 could have different shapes and layouts. For example, some interconnects may comprise more curves and turns while other interconnects may comprise fewer curves and turns, and some interconnects may comprise substantially straight lines. In some embodiments, various interconnects may intersect one another, in such a manner that they don't make an electrical connection, which can be done by using a bridge to bridge one interconnect over the other, for example.

In addition, FIG. 19 further illustrates ground contacts 328, connecting to the ground plane. Such ground contacts 328 may be used when a QP die 104 supports propagation of microwave signals to suppress microwave parallel plate modes, cross-coupling between circuit blocks, and/or substrate resonant modes. In general, providing ground pathways may improve signal quality, enable fast pulse excitation, and improve the isolation between the different lines.

Only two ground contacts are labeled in FIG. 19 with the reference numeral 328, but all white circles shown throughout FIG. 19 may illustrate exemplary locations of ground conductive contacts. The illustration of the location and the number of the ground contacts 328 in FIG. 19 is purely illustrative and, in various embodiments, ground contacts 328 may be provided at different places, as known in microwave engineering. More generally, any number of qubits 302, flux bias lines 312, microwave lines 314, coupling resonators 316, readout resonators 318, drive lines 324, contacts 320, 322, 326, and 328, and other components discussed herein with reference to the superconducting quantum circuit 300 may be included in a QP die 104.

While FIGS. 18 and 19 illustrate examples of quantum circuits comprising only two qubits 302, embodiments with any larger number of qubits are possible and are within the scope of the present disclosure. Furthermore, while FIGS. 18 and 19 may illustrate various features specific to transmon-type quantum devices, the QP dies 104 may include quantum circuits implementing other types of superconducting qubits.

In some embodiments, the face of the QP die 104 closest to the package substrate 102, and the face of the control die 103 closest to the package substrate 102, may be coated with a solder resist material (not shown). The solder resist may include silicon nitride, aluminum oxide, or silicon oxide, for example. Because the solder resist material may be lossy, it may be advantageous to avoid using solder resist material proximate to or around the coupling structures 132 in some embodiments in which one or more resonators are near the coupling structures 132. FIG. 20 illustrates the superconducting qubit-type quantum device 300 of FIG. 19 with an example area 382 around the resonator 316 in which no solder resist is provided. As discussed below, positioning a lossy material close to the resonators 316 may create spurious two-level systems that may compromise performance of the QP die 104 (e.g., by leading to qubit decoherence).

Figure 21A:
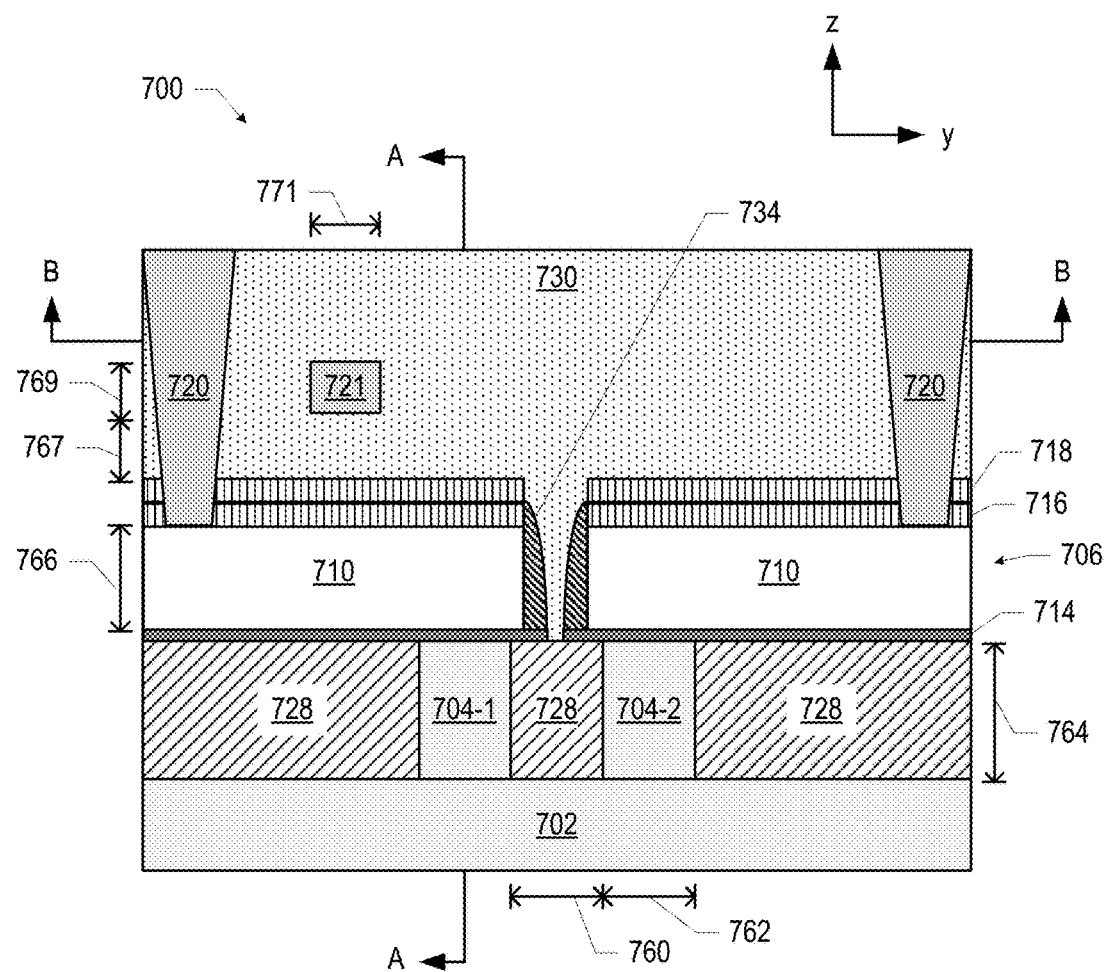
FIGS. 21A-21C are cross-sectional views of a spin qubit-type quantum device, in accordance with various embodiments.
Figure 21B:
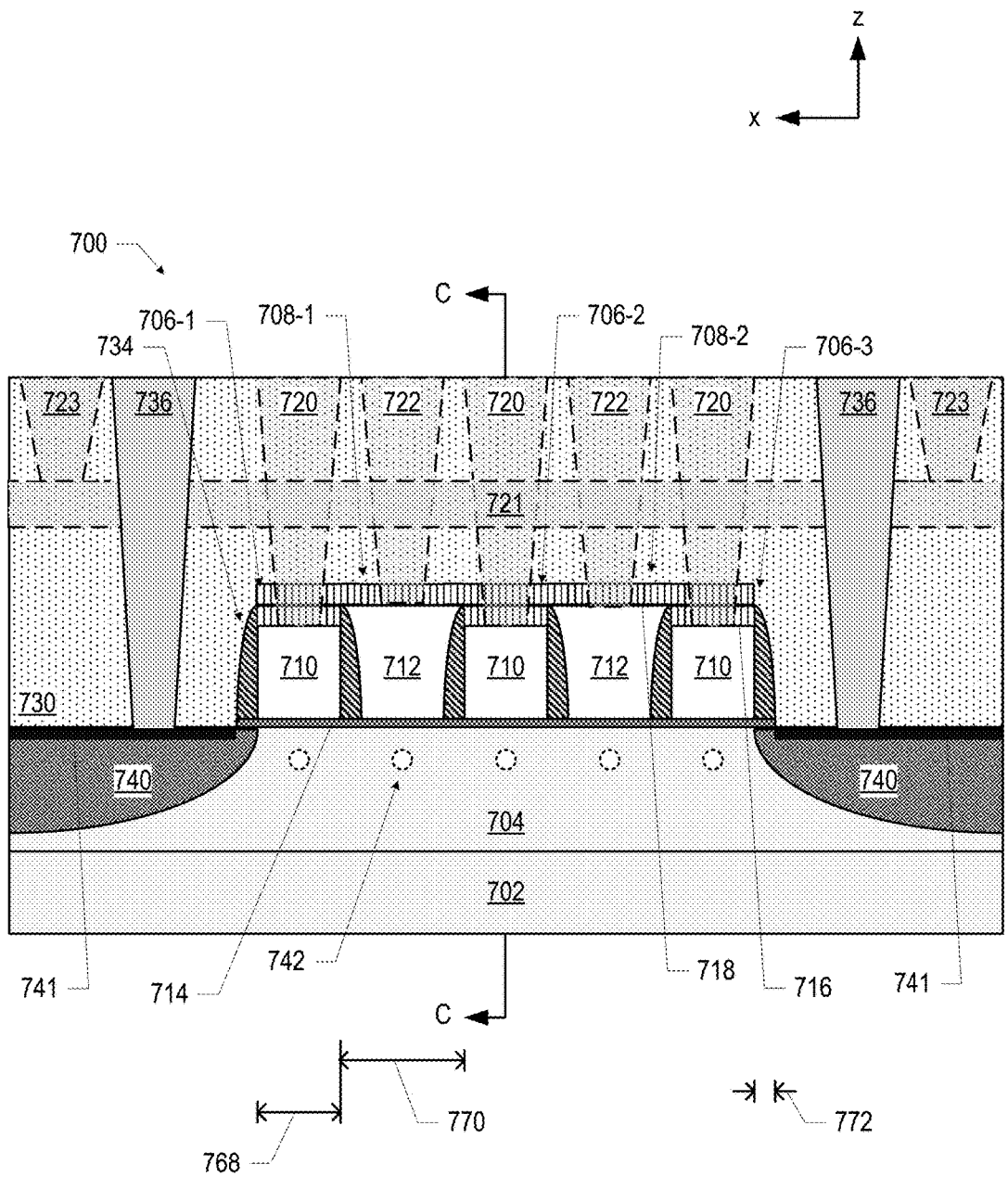
Figure 21C:
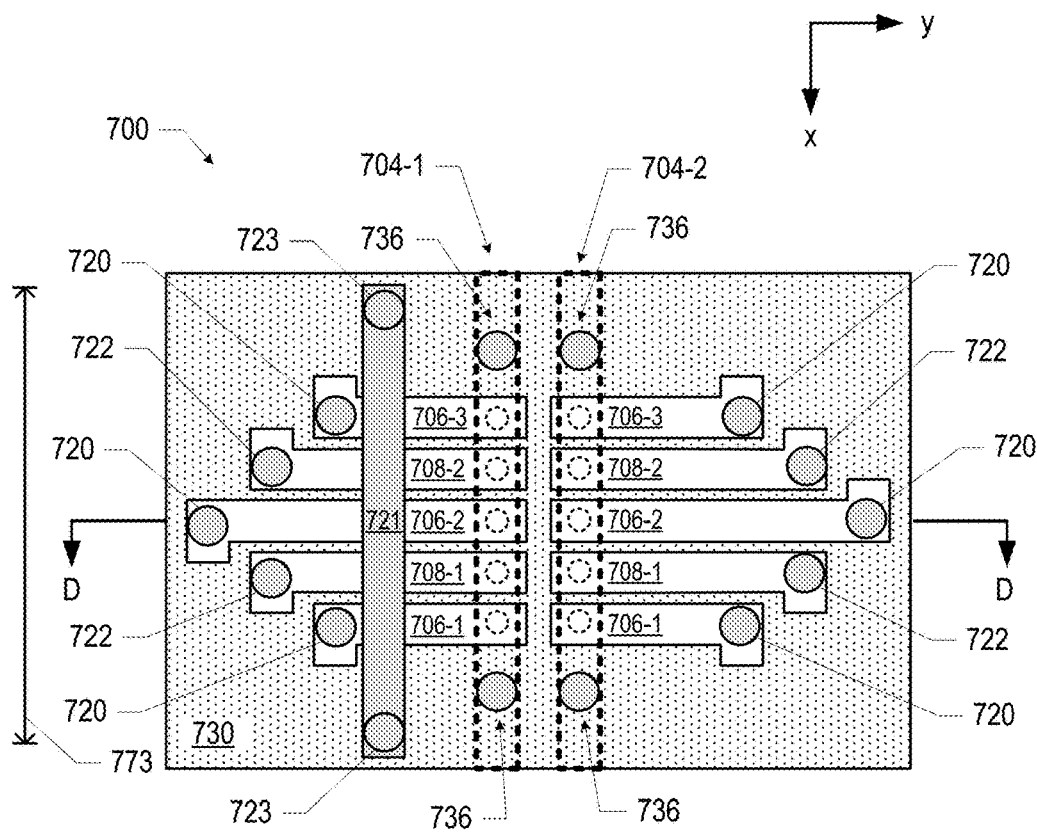

As noted above, in some embodiments, the QP die 104 may include spin qubit-type quantum devices. FIG. 21 depicts cross-sectional views of an example spin qubit-type quantum device 700, in accordance with various embodiments. In particular, FIG. 21B illustrates the spin qubit-type quantum device 700 taken along the section A-A of FIG. 21A (while FIG. 21A illustrates the spin qubit-type quantum device 700 taken along the section C-C of FIG. 21B), and FIG. 21C illustrates the spin qubit-type quantum device 700 taken along the section B-B of FIG. 21A with a number of components not shown to more readily illustrate how the gates 706/708 and the magnet line 721 may be patterned (while FIG. 21A illustrates a spin qubit-type quantum device 700 taken along the section D-D of FIG. 21C). Although FIG. 21A indicates that the cross-section illustrated in FIG. 21B is taken through the fin 704-1, an analogous cross-section taken through the fin 704-2 may be identical, and thus the discussion of FIG. 21B refers generally to the "fin 704." The spin qubit-type quantum device 700 is simply illustrative, and other spin qubit-type quantum devices may be included in a QP die 104.

The spin qubit-type quantum device 700 may include a base 702 and multiple fins 704 extending away from the base 702. The base 702 and the fins 704 may include a substrate and a quantum well stack (not shown in FIG. 21, but discussed below with reference to the substrate 744 and the quantum well stack 746), distributed in any of a number of ways between the base 702 and the fins 704. The base 702 may include at least some of the substrate, and the fins 704 may each include a quantum well layer of the quantum well stack (discussed below with reference to the quantum well layer 752).

Although only two fins, 704-1 and 704-2, are shown in FIG. 21, this is simply for ease of illustration, and more than two fins 704 may be included in the spin qubit-type quantum device 700. In some embodiments, the total number of fins 704 included in the spin qubit-type quantum device 700 is an even number, with the fins 704 organized into pairs including one active fin 704 and one read fin 704, as discussed in detail below. When the spin qubit-type quantum device 700 includes more than two fins 704, the fins 704 may be arranged in pairs in a line (e.g., 2N fins total may be arranged in a 1×2N line, or a 2×N line) or in pairs in a larger array (e.g., 2N fins total may be arranged as a 4×N/2 array, a 6×N/3 array, etc.). The discussion herein will largely focus on a single pair of fins 704 for ease of illustration, but all the teachings of the present disclosure apply to spin qubit-type quantum devices 700 with more fins 704.

As noted above, each of the fins 704 may include a quantum well layer (not shown in FIG. 21, but discussed below with reference to the quantum well layer 752). The quantum well layer included in the fins 704 may be arranged normal to the z-direction, and may provide a layer in which a two-dimensional electron gas (2DEG) may form to enable the generation of a quantum dot during operation of the spin qubit-type quantum device 700, as discussed in further detail below. The quantum well layer itself may provide a geometric constraint on the z-location of quantum dots in the fins 704, and the limited extent of the fins 704 (and therefore the quantum well layer) in the y-direction may provide a geometric constraint on the y-location of quantum dots in the fins 704. To control the x-location of quantum dots in the fins 704, voltages may be applied to gates disposed on the fins 704 to adjust the energy profile along the fins 704 in the x-direction and thereby constrain the x-location of quantum dots within quantum wells (discussed in detail below with reference to the gates 706/708). The dimensions of the fins 704 may take any suitable values. For example, in some embodiments, the fins 704 may each have a width 762 between 10 nanometers and 30 nanometers. In some embodiments, the fins 704 may each have a height 764 between 200 nanometers and 400 nanometers (e.g., between 250 nanometers and 350 nanometers, or equal to 300 nanometers).

The fins 704 may be arranged in parallel, as illustrated in FIGS. 21A and 21C, and may be spaced apart by an insulating material 728, which may be disposed on opposite faces of the fins 704. The insulating material 728 may be a dielectric material, such as silicon oxide. For example, in some embodiments, the fins 704 may be spaced apart by a distance 760 between 100 nanometers and 250 nanometers.

Multiple gates may be disposed on each of the fins 704. In the embodiment illustrated in FIG. 21B, three gates 706 and two gates 708 are shown as distributed on the top of the fin 704. This particular number of gates is simply illustrative, and any suitable number of gates may be used.

As shown in FIG. 21B, the gate 708-1 may be disposed between the gates 706-1 and 706-2, and the gate 708-2 may be disposed between the gates 706-2 and 706-3. Each of the gates 706/708 may include a gate dielectric 714; in the embodiment illustrated in FIG. 21B, the gate dielectric 714 for all the gates 706/708 is provided by a common layer of gate dielectric material. In other embodiments, the gate dielectric 714 for each of the gates 706/708 may be provided by separate portions of gate dielectric 714. In some embodiments, the gate dielectric 714 may be a multilayer gate dielectric (e.g., with multiple materials used to improve the interface between the fin 704 and the corresponding gate metal). The gate dielectric 714 may be, for example, silicon oxide, aluminum oxide, or a high-k dielectric, such as hafnium oxide. More generally, the gate dielectric 714 may include elements such as hafnium, silicon, oxygen, titanium, tantalum, lanthanum, aluminum, zirconium, barium, strontium, yttrium, lead, scandium, niobium, and zinc. Examples of materials that may be used in the gate dielectric 714 may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. In some embodiments, an annealing process may be carried out on the gate dielectric 714 to improve the quality of the gate dielectric 714.

Each of the gates 706 may include a gate metal 710 and a hardmask 716. The hardmask 716 may be formed of silicon nitride, silicon carbide, or another suitable material. The gate metal 710 may be disposed between the hardmask 716 and the gate dielectric 714, and the gate dielectric 714 may be disposed between the gate metal 710 and the fin 704. Only one portion of the hardmask 716 is labeled in FIG. 21B for ease of illustration. In some embodiments, the gate metal 710 may be a superconductor, such as aluminum, titanium nitride (e.g., deposited via ALD), or niobium titanium nitride. In some embodiments, the hardmask 716 may not be present in the spin qubit-type quantum device 700 (e.g., a hardmask like the hardmask 716 may be removed during processing, as discussed below). The sides of the gate metal 710 may be substantially parallel, as shown in FIG. 21B, and insulating spacers 734 may be disposed on the sides of the gate metal 710 and the hardmask 716. As illustrated in FIG. 21B, the spacers 734 may be thicker closer to the fin 704 and thinner farther away from the fin 704. In some embodiments, the spacers 734 may have a convex shape. The spacers 734 may be formed of any suitable material, such as a carbon-doped oxide, silicon nitride, silicon oxide, or other carbides or nitrides (e.g., silicon carbide, silicon nitride doped with carbon, and silicon oxynitride). The gate metal 710 may be any suitable metal, such as titanium nitride.

Each of the gates 708 may include a gate metal 712 and a hardmask 718. The hardmask 718 may be formed of silicon nitride, silicon carbide, or another suitable material.

The gate metal 712 may be disposed between the hardmask 718 and the gate dielectric 714, and the gate dielectric 714 may be disposed between the gate metal 712 and the fin 704. In the embodiment illustrated in FIG. 21B, the hardmask 718 may extend over the hardmask 716 (and over the gate metal 710 of the gates 706), while in other embodiments, the hardmask 718 may not extend over the gate metal 710. In some embodiments, the gate metal 712 may be a different metal from the gate metal 710; in other embodiments, the gate metal 712 and the gate metal 710 may have the same material composition. In some embodiments, the gate metal 712 may be a superconductor, such as aluminum, titanium nitride (e.g., deposited via ALD), or niobium titanium nitride. In some embodiments, the hardmask 718 may not be present in the spin qubit-type quantum device 700 (e.g., a hardmask like the hardmask 718 may be removed during processing, as discussed below).

The gate 708-1 may extend between the proximate spacers 734 on the sides of the gate 706-1 and the gate 706-2, as shown in FIG. 21B. In some embodiments, the gate metal 712 of the gate 708-1 may extend between the spacers 734 on the sides of the gate 706-1 and the gate 706-2. Thus, the gate metal 712 of the gate 708-1 may have a shape that is substantially complementary to the shape of the spacers 734, as shown. Similarly, the gate 708-2 may extend between the proximate spacers 734 on the sides of the gate 706-2 and the gate 706-3. In some embodiments in which the gate dielectric 714 is not a layer shared commonly between the gates 708 and 706, but instead is separately deposited on the fin 704 between the spacers 734, the gate dielectric 714 may extend at least partially up the sides of the spacers 734, and the gate metal 712 may extend between the portions of gate dielectric 714 on the spacers 734. The gate metal 712, like the gate metal 710, may be any suitable metal, such as titanium nitride.

The dimensions of the gates 706/708 may take any suitable values. For example, in some embodiments, the z-height 766 of the gate metal 710 may be between 40 nanometers and 75 nanometers (e.g., approximately 50 nanometers); the z-height of the gate metal 712 may be in the same range. In embodiments like the ones illustrated in FIG. 21B, the z-height of the gate metal 712 may be greater than the z-height of the gate metal 710. In some embodiments, the length 768 of the gate metal 710 (i.e., in the x-direction) may be between 20 nanometers and 40 nanometers (e.g., 30 nanometers). In some embodiments, the distance 770 between adjacent ones of the gates 706 (e.g., as measured from the gate metal 710 of one gate 706 to the gate metal 710 of an adjacent gate 706 in the x-direction, as illustrated in FIG. 21B), may be between 40 nanometers and 60 nanometers (e.g., 50 nanometers). In some embodiments, the thickness 772 of the spacers 734 may be between 1 nanometer and 10 nanometers (e.g., between 3 nanometers and 5 nanometers, between 4 nanometers and 6 nanometers, or between 4 nanometers and 7 nanometers). The length of the gate metal 712 (i.e., in the x-direction) may depend on the dimensions of the gates 706 and the spacers 734, as illustrated in FIG. 21B. As indicated in FIG. 21A, the gates 706/708 on one fin 704 may extend over the insulating material 728 beyond their respective fins 704 and towards the other fin 704, but may be isolated from their counterpart gates by the intervening insulating material 730 and spacers 734.

Although all the gates 706 are illustrated in the accompanying drawings as having the same length 768 of the gate metal 710, in some embodiments, the "outermost" gates 706 (e.g., the gates 706-1 and 706-3 of the embodiment illustrated in FIG. 21B) may have a greater length 768 than the "inner" gates 706 (e.g., the gate 706-2 in the embodiment illustrated in FIG. 21B). Such longer "outside" gates 706 may provide spatial separation between the doped regions 740 and the areas under the gates 708 and the inner gates 706 in which quantum dots 742 may form, and thus may reduce the perturbations to the potential energy landscape under the gates 708 and the inner gates 706 caused by the doped regions 740.

As shown in FIG. 21B, the gates 706 and 708 may be alternatingly arranged along the fin 704 in the x-direction. During operation of the spin qubit-type quantum device 700, voltages may be applied to the gates 706/708 to adjust the potential energy in the quantum well layer (not shown) in the fin 704 to create quantum wells of varying depths in which quantum dots 742 may form. Only one quantum dot 742 is labeled with a reference numeral in FIGS. 21B and 21C for ease of illustration, but five are indicated as dotted circles in each fin 704. The location of the quantum dots 742 in FIG. 21B is not intended to indicate a particular geometric positioning of the quantum dots 742. The spacers 734 may themselves provide "passive" barriers between quantum wells under the gates 706/708 in the quantum well layer, and the voltages applied to different ones of the gates 706/708 may adjust the potential energy under the gates 706/708 in the quantum well layer; decreasing the potential energy may form quantum wells, while increasing the potential energy may form quantum barriers.

The fins 704 may include doped regions 740 that may serve as a reservoir of charge carriers for the spin qubit-type quantum device 700. For example, an n-type doped region 740 may supply electrons for electron-type quantum dots 742, and a p-type doped region 740 may supply holes for hole-type quantum dots 742. In some embodiments, an interface material 741 may be disposed at a surface of a doped region 740, as shown. The interface material 741 may facilitate electrical coupling between a conductive contact (e.g., a via 736, as discussed below) and the doped region 740. The interface material 741 may be any suitable metal-semiconductor ohmic contact material; for example, in embodiments in which the doped region 740 includes silicon, the interface material 741 may include nickel silicide, aluminum silicide, titanium silicide, molybdenum silicide, cobalt silicide, tungsten silicide, or platinum silicide. In some embodiments, the interface material 741 may be a non-silicide compound, such as titanium nitride. In some embodiments, the interface material 741 may be a metal (e.g., aluminum, tungsten, or indium).

The spin qubit-type quantum devices 700 disclosed herein may be used to form electron-type or hole-type quantum dots 742. Note that the polarity of the voltages applied to the gates 706/708 to form quantum wells/barriers depend on the charge carriers used in the spin qubit-type quantum device 700. In embodiments in which the charge carriers are electrons (and thus the quantum dots 742 are electron-type quantum dots), amply negative voltages applied to a gate 706/708 may increase the potential barrier under the gate 706/708, and amply positive voltages applied to a gate 706/708 may decrease the potential barrier under the gate 706/708 (thereby forming a potential well in which an electron-type quantum dot 742 may form). In embodiments in which the charge carriers are holes (and thus the quantum dots 742 are hole-type quantum dots), amply positive voltages applied to a gate 706/708 may increase the potential barrier under the gate 706/708, and amply negative voltages applied to a gate 706 and 708 may decrease the potential barrier under the gate 706/708 (thereby forming a potential well in which a hole-type quantum dot 742 may form). The spin qubit-type quantum devices 700 disclosed herein may be used to form electron-type or hole-type quantum dots.

Voltages may be applied to each of the gates 706 and 708 separately to adjust the potential energy in the quantum well layer under the gates 706 and 708, and thereby control the formation of quantum dots 742 under each of the gates 706 and 708. Additionally, the relative potential energy profiles under different ones of the gates 706 and 708 allow the spin qubit-type quantum device 700 to tune the potential interaction between quantum dots 742 under adjacent gates. For example, if two adjacent quantum dots 742 (e.g., one quantum dot 742 under a gate 706 and another quantum dot 742 under a gate 708) are separated by only a short potential barrier, the two quantum dots 742 may interact more strongly than if they were separated by a taller potential barrier. Since the depth of the potential wells/height of the potential barriers under each gate 706/708 may be adjusted by adjusting the voltages on the respective gates 706/708, the differences in potential between adjacent gates 706/708 may be adjusted, and thus the interaction tuned.

In some applications, the gates 708 may be used as plunger gates to enable the formation of quantum dots 742 under the gates 708, while the gates 706 may be used as barrier gates to adjust the potential barrier between quantum dots 742 formed under adjacent gates 708. In other applications, the gates 708 may be used as barrier gates, while the gates 706 are used as plunger gates. In other applications, quantum dots 742 may be formed under all the gates 706 and 708, or under any desired subset of the gates 706 and 708.

Vias and lines may contact the gates 706/708 and the doped regions 740 to enable electrical connection to the gates 706/708 and the doped regions 740 to be made in desired locations. As shown in FIG. 21, the gates 706 may extend away from the fins 704, and vias 720 may contact the gates 706 (and are drawn in dashed lines in FIG. 21B to indicate their location behind the plane of the drawing). The vias 720 may extend through the hardmask 716 and the hardmask 718 to contact the gate metal 710 of the gates 706. The gates 708 may extend away from the fins 704, and the vias 722 may contact the gates 708 (also drawn in dashed lines in FIG. 21B to indicate their location behind the plane of the drawing). The vias 722 may extend through the hardmask 718 to contact the gate metal 712 of the gates 708. Vias 736 may contact the interface material 741 and may thereby make electrical contact with the doped regions 740. The spin qubit-type quantum device 700 may include further vias and/or lines (not shown) to make electrical contact to the gates 706/708 and/or the doped regions 740, as desired. The vias and lines included in a spin qubit-type quantum device 700 may include any suitable materials, such as copper, tungsten (deposited, e.g., by chemical vapor deposition (CVD)), or a superconductor (e.g., aluminum, tin, titanium nitride, niobium titanium nitride, tantalum, niobium, or other niobium compounds such as niobium tin and niobium germanium).

During operation, a bias voltage may be applied to the doped regions 740 (e.g., via the vias 736 and the interface material 741) to cause current to flow through the doped regions 740. When the doped regions 740 are doped with an n-type material, this voltage may be positive; when the doped regions 740 are doped with a p-type material, this voltage may be negative. The magnitude of this bias voltage may take any suitable value (e.g., between 0.25 volts and 2 volts).

The spin qubit-type quantum device 700 may include one or more magnet lines 721. For example, a single magnet line 721 is illustrated in FIG. 21 proximate to the fin 704-1. The magnet line 721 may be formed of a conductive material, and may be used to conduct current pulses that generate magnetic fields to influence the spin states of one or more of the quantum dots 742 that may form in the fins 704. In some embodiments, the magnet line 721 may conduct a pulse to reset (or "scramble") nuclear and/or quantum dot spins. In some embodiments, the magnet line 721 may conduct a pulse to initialize an electron in a quantum dot in a particular spin state. In some embodiments, the magnet line 721 may conduct current to provide a continuous, oscillating magnetic field to which the spin of a qubit may couple. The magnet line 721 may provide any suitable combination of these embodiments, or any other appropriate functionality.

In some embodiments, the magnet line 721 may be formed of copper. In some embodiments, the magnet line 721 may be formed of a superconductor, such as aluminum. The magnet line 721 illustrated in FIG. 21 is non-coplanar with the fins 704, and is also non-coplanar with the gates 706/708. In some embodiments, the magnet line 721 may be spaced apart from the gates 706/708 by a distance 767. The distance 767 may take any suitable value (e.g., based on the desired strength of the magnetic field interaction with the quantum dots 742); in some embodiments, the distance 767 may be between 25 nanometers and 1 micron (e.g., between 50 nanometers and 200 nanometers).

In some embodiments, the magnet line 721 may be formed of a magnetic material. For example, a magnetic material (such as cobalt) may be deposited in a trench in the insulating material 730 to provide a permanent magnetic field in the spin qubit-type quantum device 700.

The magnet line 721 may have any suitable dimensions. For example, the magnet line 721 may have a thickness 769 between 25 nanometers and 100 nanometers. The magnet line 721 may have a width 771 between 25 nanometers and 100 nanometers. In some embodiments, the width 771 and thickness 769 of a magnet line 721 may be equal to the width and thickness, respectively, of other conductive pads in the spin qubit-type quantum device 700 (not shown) used to provide electrical interconnects, as known in the art. The magnet line 721 may have a length 773 that may depend on the number and dimensions of the gates 706/708 that are to form quantum dots 742 with which the magnet line 721 is to interact. The magnet line 721 illustrated in FIG. 21 is substantially linear, but this need not be the case; the magnet lines 721 disclosed herein may take any suitable shape. Vias 723 may contact the magnet line 721.

The vias 720, 722, 736, and 723 may be electrically isolated from each other by an insulating material 730. The insulating material 730 may be any suitable material, such as an interlayer dielectric (ILD). Examples of the insulating material 730 may include silicon oxide, silicon nitride, aluminum oxide, carbon-doped oxide, and/or silicon oxynitride. As known in the art of integrated circuit (IC) manufacturing, vias and lines may be formed in an iterative process in which layers of structures are formed on top of each other. In some embodiments, the vias 720/722/736/723 may have a width that is 20 nanometers or greater at their widest point (e.g., 30 nanometers), and a pitch of 80 nanometers or greater (e.g., 100 nanometers). In some embodiments, conductive pads (not shown) included in the spin qubit-type quantum device 700 may have a width that is 100 nanometers or greater, and a pitch of 100 nanometers or greater. The particular arrangement of vias shown in FIG. 21 is simply illustrative, and any electrical routing arrangement may be implemented.

As discussed above, the structure of the fin 704-1 may be the same as the structure of the fin 704-2; similarly, the construction of gates 706/708 on the fin 704-1 may be the same as the construction of gates 706/708 on the fin 704-2. The gates 706/708 on the fin 704-1 may be mirrored by corresponding gates 706/708 on the parallel fin 704-2, and the insulating material 730 may separate the gates 706/708 on the different fins 704-1 and 704-2. In particular, quantum dots 742 formed in the fin 704-1 (under the gates 706/708) may have counterpart quantum dots 742 in the fin 704-2 (under the corresponding gates 706/708). In some embodiments, the quantum dots 742 in the fin 704-1 may be used as "active" quantum dots in the sense that these quantum dots 742 act as qubits and are controlled (e.g., by voltages applied to the gates 706/708 of the fin 704-1) to perform quantum computations. The quantum dots 742 in the fin 704-2 may be used as "read" quantum dots in the sense that these quantum dots 742 may sense the quantum state of the quantum dots 742 in the fin 704-1 by detecting the electric field generated by the charge in the quantum dots 742 in the fin 704-1, and may convert the quantum state of the quantum dots 742 in the fin 704-1 into electrical signals that may be detected by the gates 706/708 on the fin 704-2. Each quantum dot 742 in the fin 704-1 may be read by its corresponding quantum dot 742 in the fin 704-2. Thus, the spin qubit-type quantum device 700 enables both quantum computation and the ability to read the results of a quantum computation.

As discussed above, the base 702 and the fin 704 of a spin qubit-type quantum device 700 may be formed from a substrate 744 and a quantum well stack 746 disposed on the substrate 744. The quantum well stack 746 may include a quantum well layer in which a 2DEG may form during operation of the spin qubit-type quantum device 700. The quantum well stack 746 may take any of a number of forms, several of which are illustrated in FIG. 22. The various layers in the quantum well stacks 746 discussed below may be grown on the substrate 744 (e.g., using epitaxial processes).

Figure 22A:
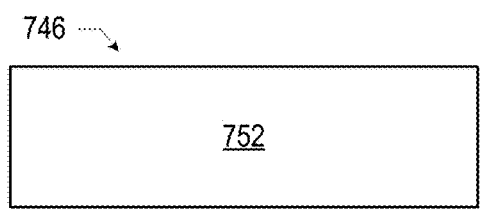
FIGS. 22A-22C are cross-sectional views of various examples of quantum well stacks that may be used in a spin qubit-type quantum device, in accordance with various embodiments.

FIG. 22A is a cross-sectional view of a quantum well stack 746 including only a quantum well layer 752. The quantum well layer 752 may be disposed on the substrate 744, and may be formed of a material such that, during operation of the spin qubit-type quantum device 700, a 2DEG may form in the quantum well layer 752 proximate to the upper surface of the quantum well layer 752. The gate dielectric 714 of the gates 706/708 may be disposed on the upper surface of the quantum well layer 752. In some embodiments, the quantum well layer 752 of FIG. 22A may be formed of intrinsic silicon, and the gate dielectric 714 may be formed of silicon oxide; in such an arrangement, during use of the spin qubit-type quantum device 700, a 2DEG may form in the intrinsic silicon at the interface between the intrinsic silicon and the silicon oxide. Embodiments in which the quantum well layer 752 of FIG. 22A is formed of intrinsic silicon may be particularly advantageous for electron-type spin qubit-type quantum devices 700. In some embodiments, the quantum well layer 752 of FIG. 22A may be formed of intrinsic germanium, and the gate dielectric 714 may be formed of germanium oxide; in such an arrangement, during use of the spin qubit-type quantum device 700, a 2DEG may form in the intrinsic germanium at the interface between the intrinsic germanium and the germanium oxide. Such embodiments may be particularly advantageous for hole-type spin qubit-type quantum devices 700. In some embodiments, the quantum well layer 752 may be strained, while in other embodiments, the quantum well layer 752 may not be strained. The thicknesses (i.e., z-heights) of the layers in the quantum well stack 746 of FIG. 22A may take any suitable values. For example, in some embodiments, the thickness of the quantum well layer 752 (e.g., intrinsic silicon or germanium) may be between 0.8 microns and 1.2 microns.

Figure 22B:
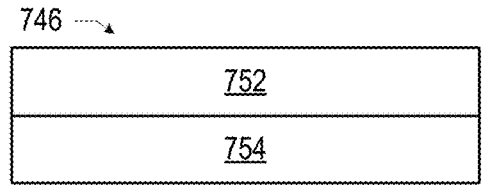

FIG. 22B is a cross-sectional view of a quantum well stack 746 including a quantum well layer 752 and a barrier layer 754. The quantum well stack 746 may be disposed on a substrate 744 such that the barrier layer 754 is disposed between the quantum well layer 752 and the substrate 744. The barrier layer 754 may provide a potential barrier between the quantum well layer 752 and the substrate 744. As discussed above, the quantum well layer 752 of FIG. 22B may be formed of a material such that, during operation of the spin qubit-type quantum device 700, a 2DEG may form in the quantum well layer 752 proximate to the upper surface of the quantum well layer 752. For example, in some embodiments in which the substrate 744 is formed of silicon, the quantum well layer 752 of FIG. 22B may be formed of silicon, and the barrier layer 754 may be formed of silicon germanium. The germanium content of this silicon germanium may be 20-80% (e.g., 30%). In some embodiments in which the quantum well layer 752 is formed of germanium, the barrier layer 754 may be formed of silicon germanium (with a germanium content of 20-80% (e.g., 70%)). The thicknesses (i.e., z-heights) of the layers in the quantum well stack 746 of FIG. 22B may take any suitable values. For example, in some embodiments, the thickness of the barrier layer 754 (e.g., silicon germanium) may be between 0 nanometers and 400 nanometers. In some embodiments, the thickness of the quantum well layer 752 (e.g., silicon or germanium) may be between 5 nanometers and 30 nanometers.

Figure 22C:
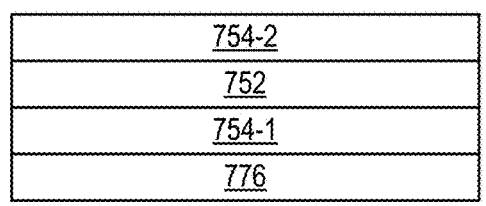

FIG. 22C is a cross-sectional view of a quantum well stack 746 including a quantum well layer 752 and a barrier layer 754-1, as well as a buffer layer 776 and an additional barrier layer 754-2. The quantum well stack 746 may be disposed on the substrate 744 such that the buffer layer 776 is disposed between the barrier layer 754-1 and the substrate 744. The buffer layer 776 may be formed of the same material as the barrier layer 754, and may be present to trap defects that form in this material as it is grown on the substrate 744. In some embodiments, the buffer layer 776 may be grown under different conditions (e.g., deposition temperature or growth rate) from the barrier layer 754-1. In particular, the barrier layer 754-1 may be grown under conditions that achieve fewer defects than the buffer layer 776. In some embodiments in which the buffer layer 776 includes silicon germanium, the silicon germanium of the buffer layer 776 may have a germanium content that varies from the substrate 744 to the barrier layer 754-1; for example, the silicon germanium of the buffer layer 776 may have a germanium content that varies from zero percent at the silicon substrate 744 to a nonzero percent (e.g., 30%) at the barrier layer 754-1. The thicknesses (i.e., z-heights) of the layers in the quantum well stack 746 of FIG. 22C may take any suitable values. For example, in some embodiments, the thickness of the buffer layer 776 (e.g., silicon germanium) may be between 0.3 microns and 4 microns (e.g., 0.3-2 microns, or 0.5 microns). In some embodiments, the thickness of the barrier layer 754-1 (e.g., silicon germanium) may be between 0 and 400 nanometers. In some embodiments, the thickness of the quantum well layer 752 (e.g., silicon or germanium) may be between 5 nanometers and 30 nanometers (e.g., 10 nanometers). The barrier layer 754-2, like the barrier layer 754-1, may provide a potential energy barrier around the quantum well layer 752, and may take the form of any of the embodiments of the barrier layer 754-1. In some embodiments, the thickness of the barrier layer 754-2 (e.g., silicon germanium) may be between 25 nanometers and 75 nanometers (e.g., 32 nanometers).

As discussed above with reference to FIG. 22B, the quantum well layer 752 of FIG. 22C may be formed of a material such that, during operation of the spin qubit-type quantum device 700, a two-dimensional electron gas (2DEG) may form in the quantum well layer 752 proximate to the upper surface of the quantum well layer 752. For example, in some embodiments in which the substrate 744 is formed of silicon, the quantum well layer 752 of FIG. 22C may be formed of silicon, and the barrier layer 754-1 and the buffer layer 776 may be formed of silicon germanium. In some such embodiments, the silicon germanium of the buffer layer 776 may have a germanium content that varies from the substrate 744 to the barrier layer 754-1; for example, the silicon germanium of the buffer layer 776 may have a germanium content that varies from zero percent at the silicon substrate 744 to a nonzero percent (e.g., 30%) at the barrier layer 754-1. In other embodiments, the buffer layer 776 may have a germanium content equal to the germanium content of the barrier layer 754-1 but may be thicker than the barrier layer 754-1 to absorb the defects that arise during growth.

In some embodiments, the quantum well layer 752 of FIG. 22C may be formed of germanium, and the buffer layer 776 and the barrier layer 754-1 may be formed of silicon germanium. In some such embodiments, the silicon germanium of the buffer layer 776 may have a germanium content that varies from the substrate 744 to the barrier layer 754-1; for example, the silicon germanium of the buffer layer 776 may have a germanium content that varies from zero percent at the substrate 744 to a nonzero percent (e.g., 70%) at the barrier layer 754-1. The barrier layer 754-1 may in turn have a germanium content equal to the nonzero percent. In other embodiments, the buffer layer 776 may have a germanium content equal to the germanium content of the barrier layer 754-1 but may be thicker than the barrier layer 754-1 to absorb the defects that arise during growth. In some embodiments of the quantum well stack 746 of FIG. 22C, the buffer layer 776 and/or the barrier layer 754-2 may be omitted.

Figure 23:
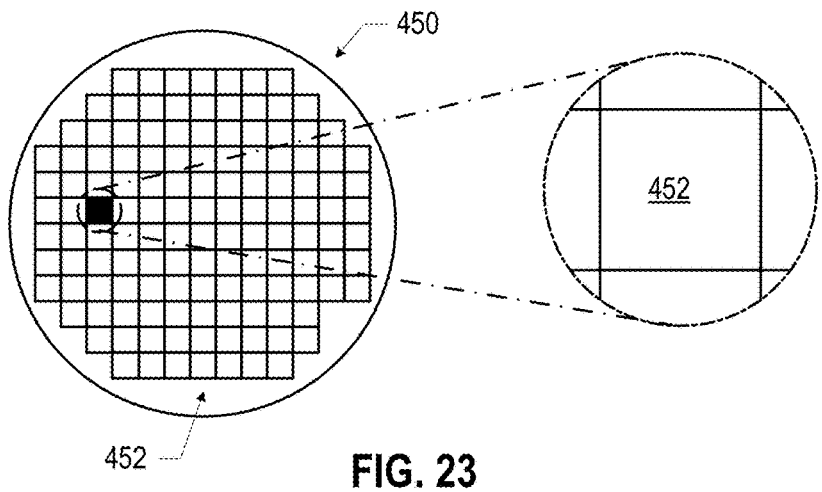
FIG. 23 is a top view of a wafer and dies that may be included in any of the quantum computing (QC) assemblies disclosed herein.

FIG. 23 is a top view of a wafer 450 and dies 452 that may be formed from the wafer 450; the dies 452 may be the QP dies 104 discussed herein. The wafer 450 may include semiconductor material and may include one or more dies 452 having conventional and/or quantum computing device elements formed on a surface of the wafer 450. Each of the dies 452 may be a repeating unit of a semiconductor product that includes any suitable conventional and/or quantum computing device. After the fabrication of the semiconductor product is complete, the wafer 450 may undergo a singulation process in which each of the dies 452 is separated from one another to provide discrete "chips" of the semiconductor product. A die 452 may include one or more quantum computing devices (e.g., the devices discussed above with reference to FIGS. 18-22) and/or supporting circuitry to route electrical signals to the quantum computing devices (e.g., interconnects including vias and lines, or control circuitry), as well as any other IC components. In some embodiments, the wafer 450 or the die 452 may include a memory device (e.g., a static random access memory (SRAM) device), a logic device (e.g., AND, OR, NAND, or NOR gate), or any other suitable circuit element. Multiple ones of these devices may be combined on a single die 452. For example, a memory array formed by multiple memory devices may be formed on a same die 452 as a processing device (e.g., the processing device 2002 of FIG. 24) or other logic that is configured to store information in the memory devices or execute instructions stored in the memory array.

Figure 24:
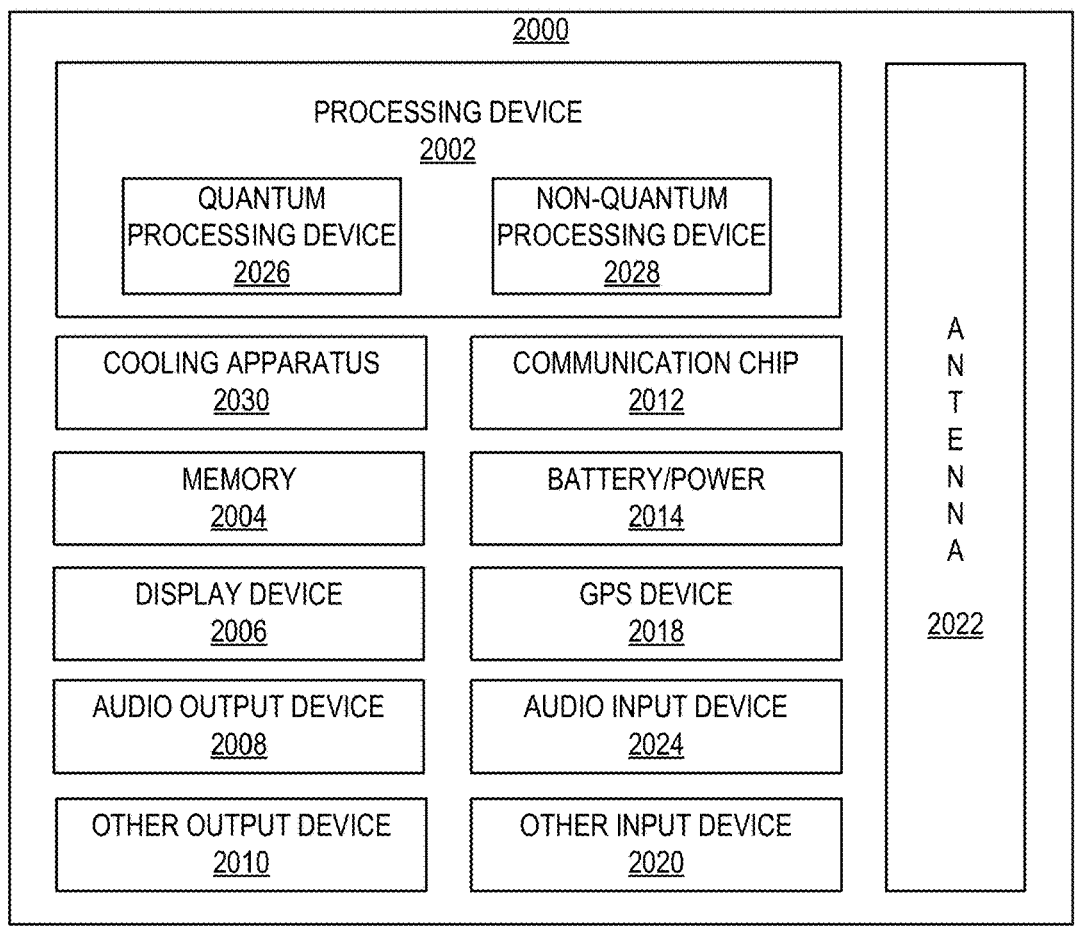
FIG. 24 is a block diagram of an example quantum computing device that may include any of the QC assemblies disclosed herein, in accordance with various embodiments.

FIG. 24 is a block diagram of an example quantum computing device 2000 that may include any of the QC assemblies 150 disclosed herein. A number of components are illustrated in FIG. 24 as included in the quantum computing device 2000, but any one or more of these components may be omitted or duplicated, as suitable for the application. In some embodiments, some or all the components included in the quantum computing device 2000 may be attached to one or more PCBs (e.g., a motherboard). In some embodiments, various ones of these components may be fabricated onto a single system-on-a-chip (SoC) die. Additionally, in various embodiments, the quantum computing device 2000 may not include one or more of the components illustrated in FIG. 24, but the quantum computing device 2000 may include interface circuitry for coupling to the one or more components. For example, the quantum computing device 2000 may not include a display device 2006, but may include display device interface circuitry (e.g., a connector and driver circuitry) to which a display device 2006 may be coupled. In another set of examples, the quantum computing device 2000 may not include an audio input device 2024 or an audio output device 2008, but may include audio input or output device interface circuitry (e.g., connectors and supporting circuitry) to which an audio input device 2024 or audio output device 2008 may be coupled.

The quantum computing device 2000 may include a processing device 2002 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2002 may include a quantum processing device 2026 (e.g., one or more quantum processing devices), and a non-quantum processing device 2028 (e.g., one or more non-quantum processing devices). The quantum processing device 2026 may include one or more of the QP dies 104 disclosed herein, and may perform data processing by performing operations on the qubits that may be generated in the QP dies 104, and monitoring the result of those operations. For example, as discussed above, different qubits may be allowed to interact, the quantum states of different qubits may be set or transformed, and the quantum states of qubits may be read. The quantum processing device 2026 may be a universal quantum processor, or specialized quantum processor configured to run one or more particular quantum algorithms. In some embodiments, the quantum processing device 2026 may execute algorithms that are particularly suitable for quantum computers, such as cryptographic algorithms that utilize prime factorization, encryption/decryption, algorithms to optimize chemical reactions, algorithms to model protein folding, etc. The quantum processing device 2026 may also include support circuitry to support the processing capability of the quantum processing device 2026, such as input/output channels, multiplexers, signal mixers, quantum amplifiers, and analog-to-digital converters.

As noted above, the processing device 2002 may include a non-quantum processing device 2028. In some embodiments, the non-quantum processing device 2028 may provide peripheral logic to support the operation of the quantum processing device 2026. For example, the non-quantum processing device 2028 may control the performance of a read operation, control the performance of a write operation, control the clearing of quantum bits, control the performance of any of the operations discussed herein, etc. The non-quantum processing device 2028 may also perform conventional computing functions to supplement the computing functions provided by the quantum processing device 2026. For example, the non-quantum processing device 2028 may interface with one or more of the other components of the quantum computing device 2000 (e.g., the communication chip 2012 discussed below, the display device 2006 discussed below, etc.) in a conventional manner, and may serve as an interface between the quantum processing device 2026 and conventional components. The non-quantum processing device 2028 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices.

The quantum computing device 2000 may include a memory 2004, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the states of qubits in the quantum processing device 2026 may be read and stored in the memory 2004. In some embodiments, the memory 2004 may include memory that shares a die with the non-quantum processing device 2028. This memory may be used as cache memory and may include embedded dynamic random access memory (eDRAM) or spin transfer torque magnetic random access memory (STT-MRAM).

The quantum computing device 2000 may include a cooling apparatus 2030. The cooling apparatus 2030 may maintain the quantum processing device 2026 at a predetermined low temperature during operation to reduce the effects of scattering in the quantum processing device 2026. This predetermined low temperature may vary depending on the setting; in some embodiments, the temperature may be 5 Kelvin or less. In some embodiments, the non-quantum processing device 2028 (and various other components of the quantum computing device 2000) may not be cooled by the cooling apparatus 2030, and may instead operate at room temperature. The cooling apparatus 2030 may be, for example, a dilution refrigerator, a helium-3 refrigerator, or a liquid helium refrigerator.

In some embodiments, the quantum computing device 2000 may include a communication chip 2012 (e.g., one or more communication chips). For example, the communication chip 2012 may be configured for managing wireless communications for the transfer of data to and from the quantum computing device 2000. The term "wireless" and its derivatives may be used to describe circuits, devices, systems, methods, techniques, communications channels, etc. that may communicate data through the use of modulated electromagnetic radiation through a nonsolid medium. The term does not imply that the associated devices do not contain any wires, although in some embodiments they might not.

The communication chip 2012 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2012 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2012 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2012 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2012 may operate in accordance with other wireless protocols in other embodiments. The quantum computing device 2000 may include an antenna 2022 to facilitate wireless communications and/or to receive other wireless communications (such as AM or FM radio transmissions).

In some embodiments, the communication chip 2012 may manage wired communications, such as electrical, optical, or any other suitable communication protocols (e.g., the Ethernet). As noted above, the communication chip 2012 may include multiple communication chips. For instance, a first communication chip 2012 may be dedicated to shorter-range wireless communications such as Wi-Fi or Bluetooth, and a second communication chip 2012 may be dedicated to longer-range wireless communications such as global positioning system (GPS), EDGE, GPRS, CDMA, WiMAX, LTE, EV-DO, or others. In some embodiments, a first communication chip 2012 may be dedicated to wireless communications, and a second communication chip 2012 may be dedicated to wired communications.

The quantum computing device 2000 may include battery/power circuitry 2014. The battery/power circuitry 2014 may include one or more energy storage devices (e.g., batteries or capacitors) and/or circuitry for coupling components of the quantum computing device 2000 to an energy source separate from the quantum computing device 2000 (e.g., AC line power).

The quantum computing device 2000 may include a display device 2006 (or corresponding interface circuitry, as discussed above). The display device 2006 may include any visual indicators, such as a heads-up display, a computer monitor, a projector, a touchscreen display, a liquid crystal display (LCD), a light-emitting diode display, or a flat panel display.

The quantum computing device 2000 may include an audio output device 2008 (or corresponding interface circuitry, as discussed above). The audio output device 2008 may include any device that generates an audible indicator, such as speakers, headsets, or earbuds, for example.

The quantum computing device 2000 may include an audio input device 2024 (or corresponding interface circuitry, as discussed above). The audio input device 2024 may include any device that generates a signal representative of a sound, such as microphones, microphone arrays, or digital instruments (e.g., instruments having a musical instrument digital interface (MIDI) output).

The quantum computing device 2000 may include a GPS device 2018 (or corresponding interface circuitry, as discussed above). The GPS device 2018 may be in communication with a satellite-based system and may receive a location of the quantum computing device 2000, as known in the art.

The quantum computing device 2000 may include another output device 2010 (or corresponding interface circuitry, as discussed above). Examples of the other output device 2010 may include an audio codec, a video codec, a printer, a wired or wireless transmitter for providing information to other devices, or an additional storage device.

The quantum computing device 2000 may include another input device 2020 (or corresponding interface circuitry, as discussed above). Examples of the other input device 2020 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The following paragraphs provide various examples of the embodiments disclosed herein.

Example 1 is a quantum computing (QC) assembly, including: a quantum processing die; a control die; and a flexible interconnect electrically coupling the quantum processing die and the control die, wherein the flexible interconnect includes a plurality of transmission lines and a shield structure to mitigate cross-talk between the transmission lines.

Example 2 may include the subject matter of Example 1, and may further specify that the flexible interconnect includes a flexible portion having a first end and an opposing second end, a first rigid connection portion at the first end, and a second rigid connection portion at the second end.

Example 3 may include the subject matter of Example 2, and may further include a circuit component, wherein the quantum processing die and the first rigid connection portion are coupled to the circuit component, and the circuit component includes electrical pathways to electrically couple the quantum processing die and the first rigid connection portion.

Example 4 may include the subject matter of Example 3, and may further specify that the first rigid connection portion is soldered to the circuit component, and the solder includes indium.

Example 5 may include the subject matter of Example 3, and may further specify that the first rigid connection portion is coupled to the circuitry component with a press-fit connector.

Example 6 may include the subject matter of any of Examples 1-5, and may further specify that the plurality of transmission lines have a longitudinal portion and at least one transverse portion.

Example 7 may include the subject matter of Example 6, and may further specify that a pitch of the plurality of transmission lines in the longitudinal portion is less than a pitch of the plurality of transmission lines in the transverse portion.

Example 8 may include the subject matter of any of Examples 6-7, and may further specify that the shield structure includes a plurality of rectangular sleeves in the longitudinal portion, and a plurality of hexagonal sleeves in the transverse portion.

Example 9 may include the subject matter of any of Examples 1-8, and may further specify that a portion of the shield structure includes a line via between an adjacent pair of transmission lines.

Example 10 may include the subject matter of any of Examples 1-9, and may further specify that the shield structure includes a plurality of rectangular sleeves.

Example 11 may include the subject matter of any of Examples 1-10, and may further specify that the shield structure includes a plurality of air gaps.

Example 12 may include the subject matter of Example 11, and may further specify that individual ones of the air gaps are fluidly coupled to one or more external openings in the flexible interconnect.

Example 13 may include the subject matter of any of Examples 11-12, and may further specify that at least some of the air gaps are disposed around transmission lines.

Example 14 may include the subject matter of any of Examples 11-13, and may further specify that at least some of the air gaps are disposed between portions of dielectric material that surround different transmission lines.

Example 15 may include the subject matter of any of Examples 1-14, and may further specify that the control die includes a multiplexer or a filter.

Example 16 may include the subject matter of any of Examples 1-15, and may further specify that the quantum processing die includes one or more Josephson junctions, or a quantum well stack.

Example 17 is an interconnect, including: a plurality of transmission lines; and a shield structure to mitigate cross-talk between the transmission lines, wherein the shield structure includes a plurality of air gaps and individual ones of the air gaps are fluidly coupled to one or more external openings in the interconnect.

Example 18 may include the subject matter of Example 17, and may further specify that the shield structure includes a plurality of rectangular sleeves.

Example 19 may include the subject matter of any of Examples 17-18, and may further specify that the plurality of rectangular sleeves each include at least one opening fluidly coupled to one or more external openings.

Example 20 may include the subject matter of any of Examples 17-19, and may further specify that a portion of dielectric material is between individual ones of the transmission lines and a proximate surface of the shield structure.

Example 21 may include the subject matter of any of Examples 17-20, and may further specify that the transmission lines include a superconducting material.

Example 22 is in interconnect, including: a plurality of transmission lines; portions of dielectric material surrounding individual transmission lines; a metal surrounding individual portions of dielectric material; and an air gap between at least one adjacent pair of portions of dielectric material.

Example 23 may include the subject matter of Example 22, and may further specify that the metal includes a superconductor.

Example 24 may include the subject matter of any of Examples 22-23, and may further specify that the metal includes a planar portion under the portion of dielectric material and a conformal portion over the portion of dielectric material.

Example 25 may include the subject matter of any of Examples 22-24, and may further specify that individual ones of the air gaps are fluidly coupled to one or more external openings in the interconnect.

Example 26 may include the subject matter of any of Examples 22-25, and may further specify that the dielectric material is a flexible material.

Example 27 is a method of manufacturing an interconnect, including: forming a first dielectric layer on a first metal layer; forming line vias on the first dielectric layer; forming a second dielectric layer on the line vias and the first dielectric layer; forming islands by etching recesses through the first and second dielectric layers between the line vias to expose the first metal layer; and after forming the islands, forming a conformal second metal layer over the islands and the exposed first metal layer.

Example 28 may include the subject matter of Example 27, and may further include forming a third metal layer over the second metal layer, wherein the third metal layer is substantially planar.

Example 29 may include the subject matter of any of Examples 27-20, and may further specify that the second metal layer includes a superconductor.

Example 30 may include the subject matter of any of Examples 27-29, and may further specify that the line vias are first line vias, the islands are first islands, and the method further includes: forming a third dielectric layer on the third metal layer; forming second line vias on the third dielectric layer; forming a fourth dielectric layer on the second line vias and the third dielectric layer; forming second islands by etching recesses through the third and fourth dielectric layers between the second line vias to expose the third metal layer; and after forming the second islands, forming a conformal fourth metal layer over the second islands and the exposed third metal layer.

Example 31 may include the subject matter of any of Examples 27-30, and may further specify that an island includes multiple transmission lines.

The invention claimed is:

1. A quantum computing (QC) assembly, comprising:
a quantum processing die;
a control die; and
a flexible interconnect electrically coupling the quantum processing die and the control die,
wherein the flexible interconnect includes a plurality of transmission lines and a shield structure to mitigate cross-talk between the transmission lines, and the shield structure includes a plurality of air gaps.

2. The QC assembly of claim 1, wherein the flexible interconnect includes a flexible portion having a first end and an opposing second end, a first rigid connection portion at the first end, and a second rigid connection portion at the second end.

3. The QC assembly of claim 2, further comprising:
a circuit component;
wherein the quantum processing die and the first rigid connection portion are coupled to the circuit component, and the circuit component includes electrical pathways to electrically couple the quantum processing die and the first rigid connection portion.

4. The QC assembly of claim 1, wherein the plurality of transmission lines have a longitudinal portion and at least one transverse portion.

5. The QC assembly of claim 4, wherein a pitch of the plurality of transmission lines in the longitudinal portion is less than a pitch of the plurality of transmission lines in the transverse portion.

6. The QC assembly of claim 4, wherein the shield structure includes a plurality of rectangular sleeves in the longitudinal portion, and a plurality of hexagonal sleeves in the transverse portion.

7. The QC assembly of claim 1, wherein the shield structure includes a plurality of rectangular sleeves.

8. The QC assembly of claim 1, wherein individual ones of the air gaps are fluidly coupled to one or more external openings in the flexible interconnect.

9. The QC assembly of claim 1, wherein at least some of the air gaps are disposed around transmission lines.

10. The QC assembly of claim 1, wherein at least some of the air gaps are disposed between portions of dielectric material that surround different transmission lines.

11. The QC assembly of claim 1, wherein the control die includes a multiplexer or a filter.

12. The QC assembly of claim 1, wherein the quantum processing die includes one or more Josephson junctions, or the quantum processing die includes a quantum well stack.

13. The QC assembly of claim 1, wherein individual ones of the air gaps are fluidly coupled to one or more external openings in the flexible interconnect.

14. The QC assembly of claim 1, wherein the shield structure includes a plurality of rectangular sleeves.

15. The QC assembly of claim 14, wherein the plurality of rectangular sleeves each include at least one opening fluidly coupled to one or more external openings.

16. The QC assembly of claim 1, wherein a portion of dielectric material is between individual ones of the transmission lines and a proximate surface of the shield structure.

17. The QC assembly of claim 1, wherein the shield structure includes portions of dielectric material surrounding individual transmission lines and a metal surrounding individual portions of dielectric material.

18. The QC assembly of claim 17, wherein an air gap is between at least one adjacent pair of portions of dielectric material.

19. The QC assembly of claim 17, wherein the metal includes a superconductor.

20. The QC assembly of claim 17, wherein the metal includes a planar portion under the portion of dielectric material and a conformal portion over the portion of dielectric material.

21. A quantum computing (QC) assembly, comprising:
a quantum processing die; and
a flexible interconnect electrically coupled to the quantum processing die, wherein the flexible interconnect includes a plurality of transmission lines and a shield structure to mitigate cross-talk between the transmission lines, and the shield structure includes an air gap.

22. The QC assembly of claim 21, wherein the plurality of transmission lines have a longitudinal portion and at least one transverse portion.

23. The QC assembly of claim 22, wherein the shield structure includes a plurality of rectangular sleeves in the longitudinal portion, and a plurality of hexagonal sleeves in the transverse portion.

24. The QC assembly of claim 21, wherein the air gap is fluidly coupled to one or more external openings in the flexible interconnect.

25. The QC assembly of claim 21, wherein the shield structure includes a metal.

* * * * *